(12) United States Patent
Then et al.

(10) Patent No.: US 11,508,824 B2
(45) Date of Patent: Nov. 22, 2022

(54) GALLIUM NITRIDE TRANSISTORS WITH MULTIPLE THRESHOLD VOLTAGES AND THEIR METHODS OF FABRICATION

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 16/630,143

(22) PCT Filed: Sep. 28, 2017

(86) PCT No.: PCT/US2017/054137
§ 371 (c)(1),
(2) Date: Jan. 10, 2020

(87) PCT Pub. No.: WO2019/066871
PCT Pub. Date: Apr. 4, 2019

(65) Prior Publication Data
US 2020/0235216 A1    Jul. 23, 2020

(51) Int. Cl.
*H01L 29/20* (2006.01)
*H01L 29/423* (2006.01)
(Continued)

(52) U.S. Cl.
CPC .... *H01L 29/42368* (2013.01); *H01L 29/2003* (2013.01); *H01L 29/7783* (2013.01); *H03F 3/193* (2013.01); *H03F 2200/451* (2013.01)

(58) Field of Classification Search
CPC ........... H01L 29/42368; H01L 29/2003; H01L 29/7783; H01L 29/0657; H01L 29/0847;
(Continued)

(56) References Cited

U.S. PATENT DOCUMENTS

2007/0224751 A1*  9/2007  Roizin .............. H01L 29/40117
                                                  438/199
2009/0066411 A1*  3/2009  Whelan ................. H03F 3/1935
                                                  330/2
(Continued)

FOREIGN PATENT DOCUMENTS

JP        2015-162641        9/2015
WO        WO-2014099003      6/2014
WO        WO-2015147802 A1 * 10/2015  ......... H01L 29/0847

OTHER PUBLICATIONS

International Search Report and Written Opinion for International Patent Application No. PCT/US2017/054137 dated May 29, 2018, 10 pgs.
International Preliminary Report on Patentability for International Patent Application No. PCT/US2017/054137, dated Apr. 9, 2020, 7 pgs.

*Primary Examiner* — S M Sohel Imtiaz
(74) *Attorney, Agent, or Firm* — Schwabe, Williamson & Wyatt P.C.

(57) ABSTRACT

Gallium nitride transistors having multiple threshold voltages are described. In an example, a transistor includes a gallium nitride layer over a substrate, a gate stack over the gallium nitride layer, a source region on a first side of the gate stack, and a drain region on a second side of the gate stack, the second side opposite the first side, wherein the gate stack has a gate length in a first direction extending from the source region to the drain region, the gate stack having a gate width in a second direction perpendicular to the first direction and parallel to the source region and the drain region. The transistor also includes a polarization layer beneath the gate stack and on the GaN layer, the polarization
(Continued)

layer having a first portion having a first thickness under a first gate portion and a second thickness under a second gate portion.

16 Claims, 16 Drawing Sheets

(51) Int. Cl.
*H01L 29/778* (2006.01)
*H03F 3/193* (2006.01)

(58) Field of Classification Search
CPC ........... H01L 29/7786; H01L 29/66545; H01L 29/42376; H01L 29/4236; H03F 3/193; H03F 2200/451
See application file for complete search history.

(56) References Cited

U.S. PATENT DOCUMENTS

| | | | | |
|---|---|---|---|---|
| 2010/0327322 | A1* | 12/2010 | Kub | H01L 29/205 |
| | | | | 257/194 |
| 2012/0098599 | A1* | 4/2012 | Chang | H01L 29/7787 |
| | | | | 330/277 |
| 2014/0175515 | A1* | 6/2014 | Then | H01L 29/772 |
| | | | | 257/194 |
| 2014/0353720 | A1* | 12/2014 | Inoue | H01L 29/2003 |
| | | | | 257/192 |
| 2016/0336436 | A1* | 11/2016 | Yang | H01L 29/7786 |
| 2016/0365435 | A1* | 12/2016 | Then | H01L 29/66446 |
| 2017/0200794 | A1* | 7/2017 | Huang | H01L 21/3205 |

\* cited by examiner

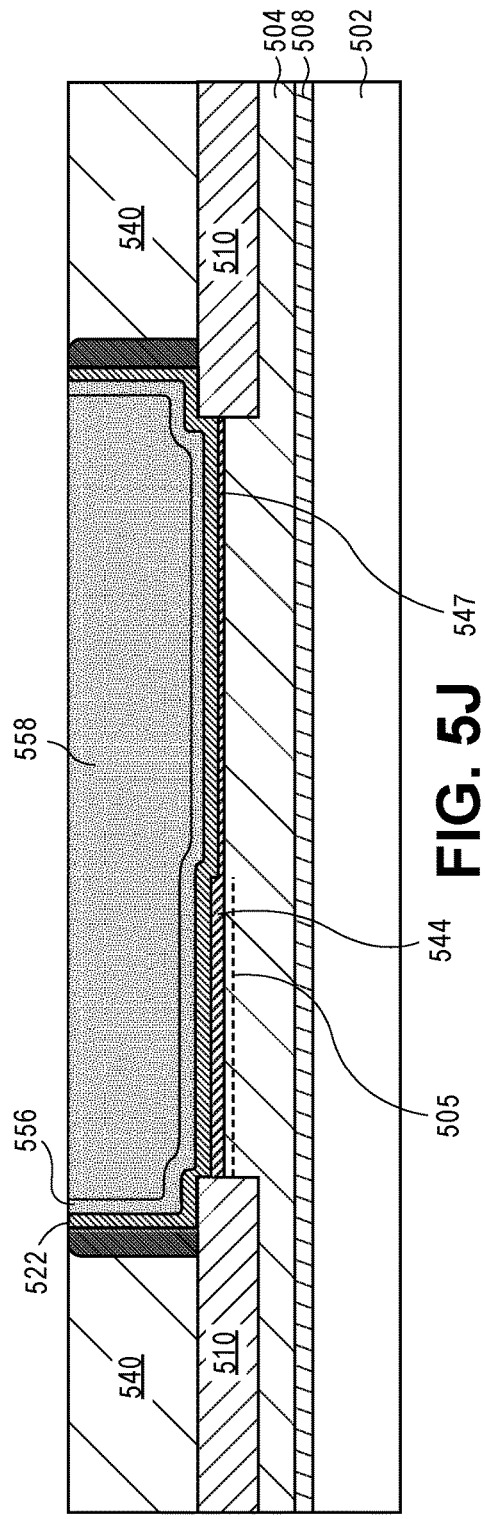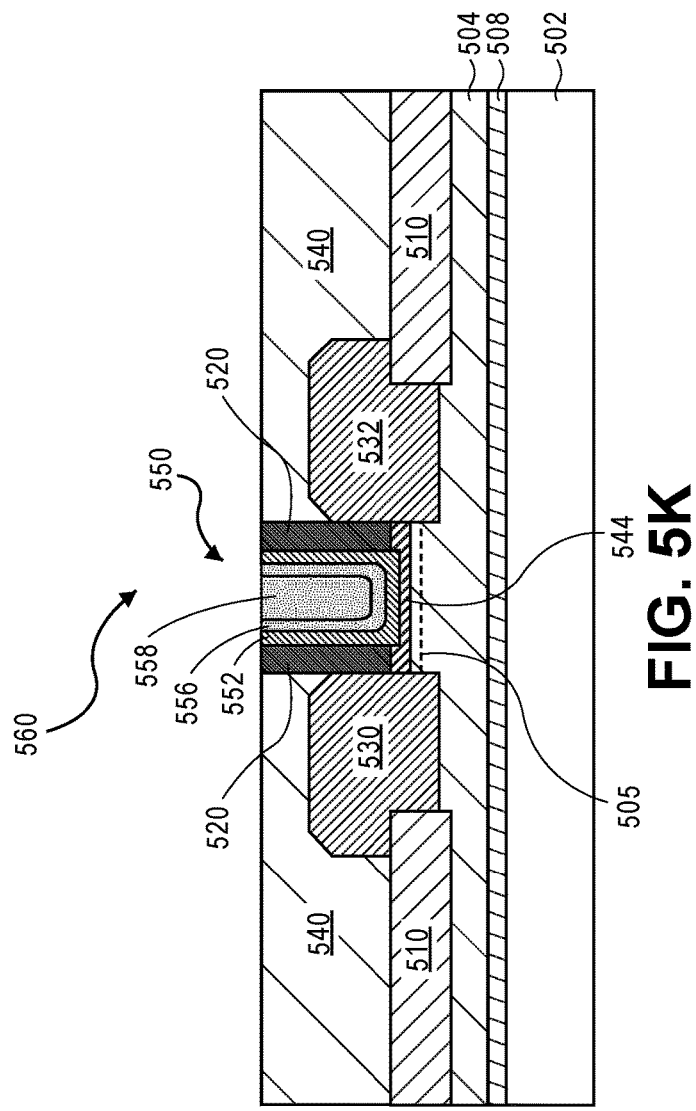

GALLIUM NITRIDE TRANSISTORS WITH MULTIPLE THRESHOLD VOLTAGES AND THEIR METHODS OF FABRICATION

CROSS-REFERENCE TO RELATED APPLICATION

This patent application is a U.S. National Phase Application under 35 U.S.C. § 371 of International Application No. PCT/US2017/054137, filed Sep. 28, 2017, entitled "GALLIUM NITRIDE TRANSISTORS WITH MULTIPLE THRESHOLD VOLTAGES AND THEIR METHODS OF FABRICATION," which designates the United States of America, the entire disclosure of which is hereby incorporated by reference in its entirety and for all purposes.

TECHNICAL FIELD

Embodiments of the present disclosure relate to semiconductor integrated circuits and more particularly to gallium nitride (GaN) transistors having multiple threshold voltages and their methods of fabrication.

BACKGROUND

RF power amplifiers (RF PAs) are needed to transmit RF signals between mobile devices and base stations located at far distances away, such as greater than 1 mile. The efficiency of these RF PAs is a key determinant of battery life in mobile handsets and power consumption (cost) in RF base stations. Good linearity of the RF power amplifier is required for modern communication standards such as 4G LTE and future 5G standards. RF PAs typically operate at several dB back-off from its saturated mode in order to meet the linearity requirements. Thus, the efficiency suffers and in most PAs, it may degrade by a factor of 2-3X.

BRIEF DESCRIPTION OF THE DRAWINGS

FIGS. 5A-5K illustrate cross-sectional views of a method of fabricating a GaN transistor having multiple threshold voltage in accordance with embodiments of the present disclosure.

EMBODIMENTS OF THE DISCLOSURE

Figure 1A:
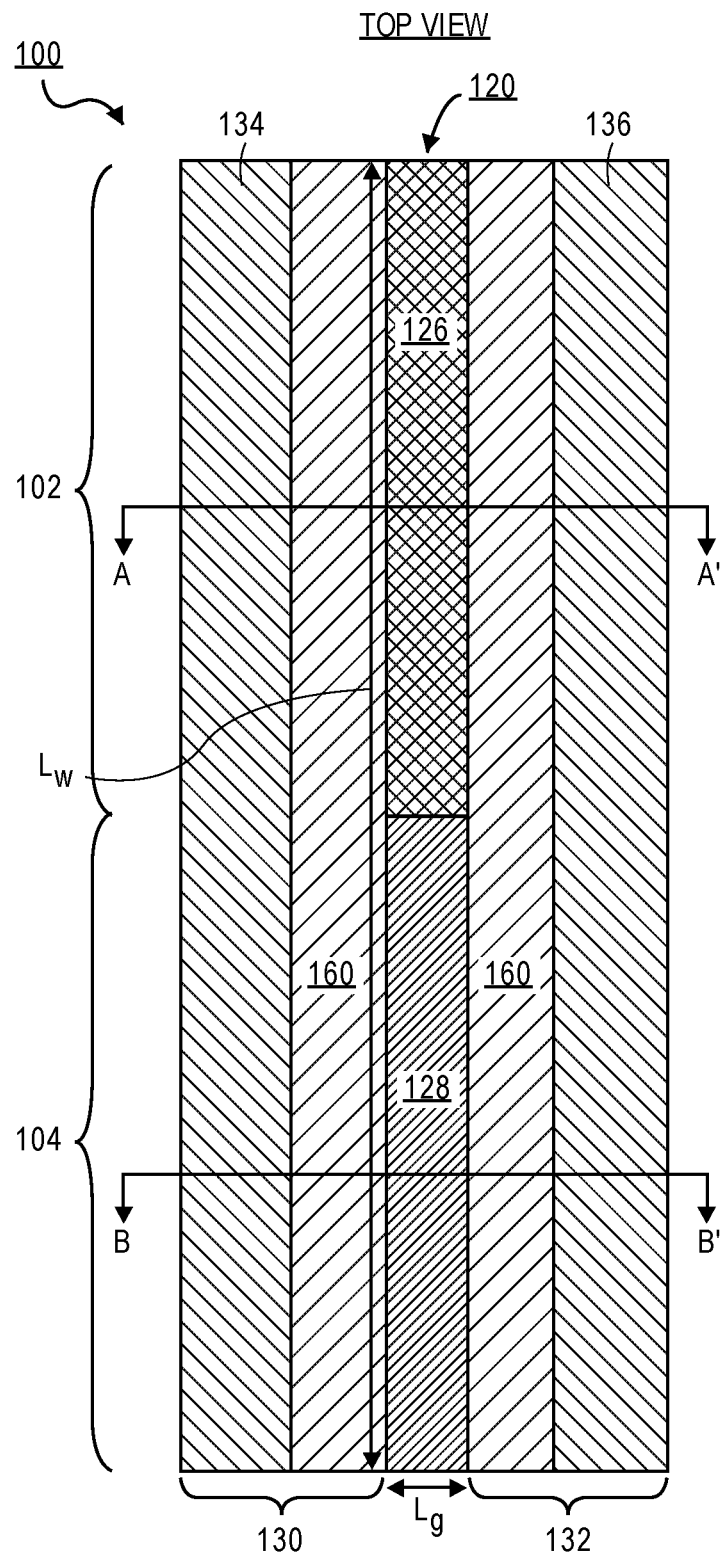
FIGS. 1A-1C illustrate a GaN transistor in accordance with embodiments of the present disclosure.

Gallium nitride (GaN) transistors having multiple threshold voltages and their methods of fabrication are described.

In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Embodiments of the disclosure relate to gallium nitride (GaN) transistors having multiple threshold voltages and their methods of fabrication. A GaN transistor, in accordance with embodiments, includes a gallium nitride layer above a substrate, such as a silicon monocrystalline substrate. A gate stack is disposed above the GaN layer. A source region and a drain region are disposed on opposite sides of the gate stack. A polarization layer comprising a group III-N semiconductor is disposed on the GaN layer and beneath the gate stack. The polarization layer may have a first thickness, including a zero thickness, beneath a first gate portion of the gate stack and a second thickness greater than the first thickness beneath a second gate portion of the gate stack. The thickness of the polarization layer or lack of a polarization layer beneath the gate stack affects the threshold voltage of the overlying portion of the gate stack. By providing different thicknesses of the polarization layer beneath different portions of the gate stack, a transistor may be engineered to have two or more different threshold voltages. In an embodiment, a transistor has a threshold voltage in the range of 1V to −6V. A GaN transistor having multiple threshold voltages may be fabricated as a planar transistor or a nonplanar transistor. In embodiments of the present disclosure, a GaN transistor having two or more threshold voltages may be used to create a hybrid class A+AB power amplifier with improved linearity.

Figure 1B:
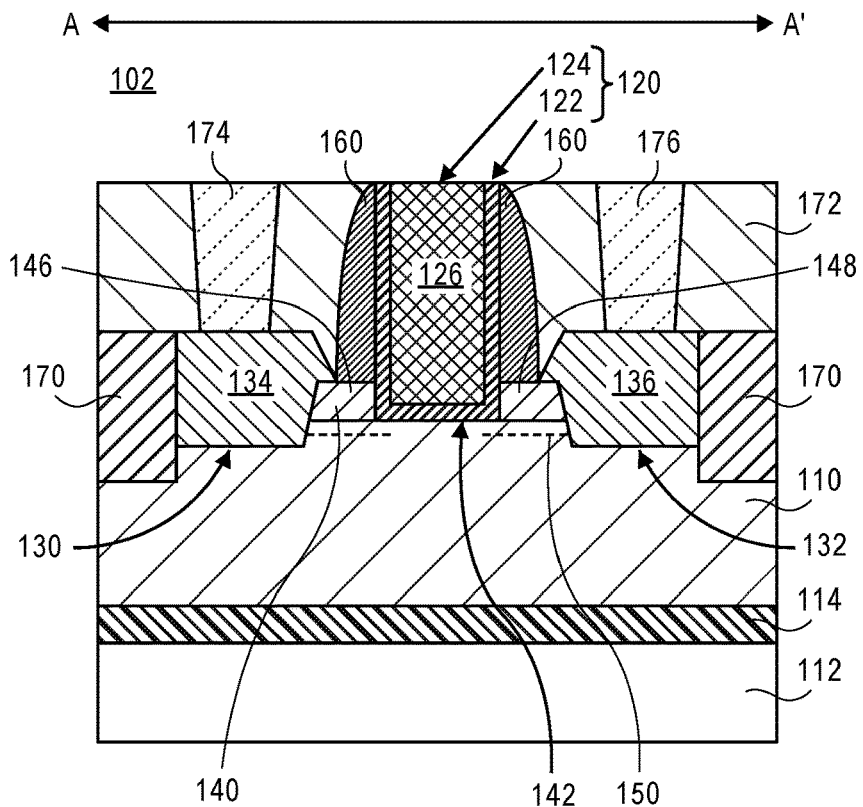
Figure 1C:
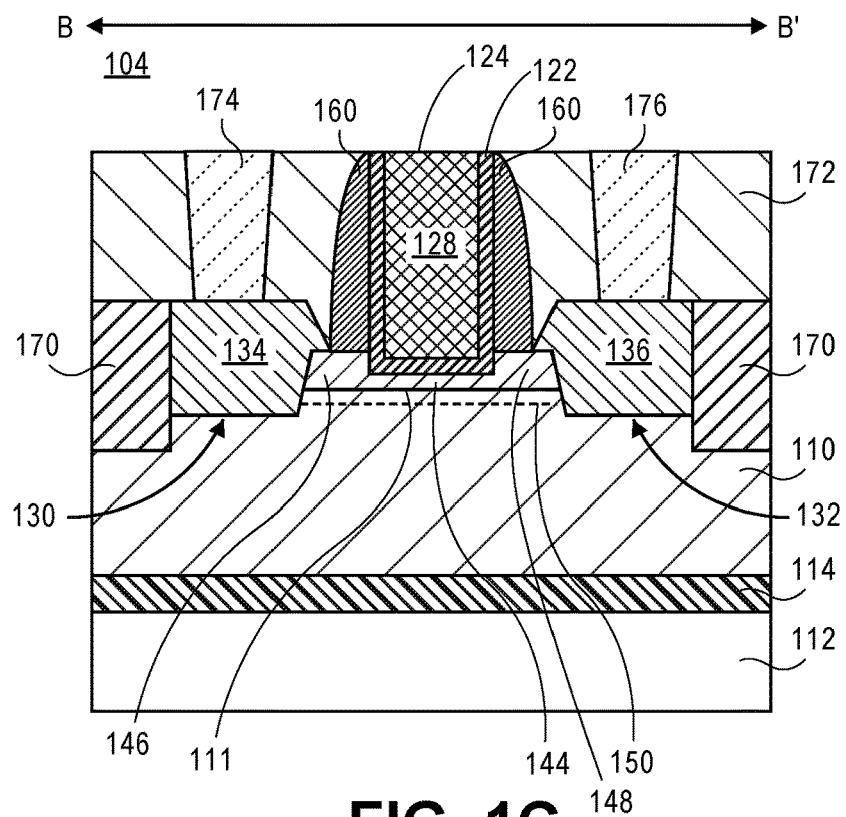

FIGS. 1A-1C illustrate a GaN transistor 100 in accordance with embodiments of the present disclosure. FIG. 1A is a top down view illustrating GaN transistor 100 while FIG. 1B is as cross-sectional view taken through a first portion 102 of transistor 100 and FIG. 1C is a cross-sectional view taken through a section of portion 104 of transistor 100. Transistor 100 includes a gallium nitride (GaN) layer 110 disposed above a substrate 112, such as but not limited to a silicon monocrystalline substrate. A buffer layer 114, such as an aluminum nitride (AlN) layer, may be disposed between substrate 112 and GaN layer 110. GaN layer 110 provides a channel layer for transistor layer 100. A gate stack 120 is disposed above the GaN layer 110 as illustrated in FIGS. 1B and 1C. The gate stack may include a gate dielectric 122 and a gate electrode 124 with the gate dielectric 122 between the gate electrode 124 and GaN layer 110. In an embodiment, the gate dielectric 122 is a high-k gate dielectric such as but not limited to a hafnium oxide (e.g., $HfO_2$) or aluminum oxide (e.g., $Al_2O_3$) gate dielectric layer.

A source region 130 and a drain region 132 may be disposed on opposite sides of gate stack 120 as illustrated in FIGS. 1A-1C. In an embodiment source region 130 and includes a group III-N semiconductor contact 134, such as but not limited to InGaN, and drain region 132 includes a group III-N semiconductor contact 136. In an embodiment, group III-N semiconductor contacts 134 and 136 are a single crystalline III-N semiconductor, and may be doped to an N+ conductivity (e.g., greater than 1E18 concentration) with, e.g., silicon. Transistor 100 has a gate length (Lg) which extends in a first direction between source region 130 and drain region 132. When transistor 100 is in an "ON" state current flows between source region 130 and drain region 132 in the first direction. Transistor 100 has a gate width (Gw) in a second direction, perpendicular to the first direction or to the gate length direction, and parallel to the source and drain regions 130 and 132 as illustrated in FIG. 1A. In an embodiment, the gate width of transistor 100 is between 10 and 100 microns.

Transistor 100 includes a polarization layer 140. In an embodiment, polarization layer 140 is a group III-N semiconductor, such as but not limited to a group III-N semiconductor comprising aluminum, gallium, indium and nitrogen or $Al_xIn_yGa_{1-x-y}N$ ($0<x<=1$, $0<=y<1$). In an embodiment, $x=0.83$ and $y=0.17$, where $Al_{0.83}In_{0.17}N$ is lattice-matched to GaN. In an embodiment, the polarization layer 140 is disposed directly on a surface 111 of GaN layer 110 which is a (0001) plane or a C-plane of gallium nitride. Depending on the composition and thickness of polarization layer 140, polarization layer 140 may create a 2DEG layer 150 in the top surface of GaN layer 110 as illustrated in FIGS. 1B and 1C.

In an embodiment of the present disclosure, a first portion 102 of transistor 100 has a first gate portion 126 of gate stack 120 disposed over a first portion 142 of polarization layer 140 having a first thickness, which may be a zero thickness, while a second portion 104 of transistor 100 has a second gate portion 128 of gate stack 120 disposed over a second portion 144 of polarization layer 140 having a second thickness, wherein the second thickness is greater than the first thickness. The difference in thicknesses between the first portion 142 and the second portion 144 of polarization layer 140 creates a difference in the threshold voltages for the first gate portion 126 of gate stack 120 and the second gate portion 128 of gate stack 120 where the threshold voltage (VT1) of the first gate portion 126 is greater than the threshold voltage (VT2) of the second gate portion 128. In an embodiment, the first threshold voltage (VT1) is greater than the second threshold voltage (VT2) by an amount in the range of 100 mV to 9V. In an embodiment, the first threshold voltage (VT1) is greater than the second threshold voltage (VT2) by greater than 2V.

In a specific embodiment, as shown in FIGS. 1B and 1C, the first portion 142 of polarization layer 140 has a thickness of zero. That is, there is no polarization layer 140 beneath the first gate portion 126 of gate stack 120 and the first gate portion 126 is disposed directly on GaN layer 110 as illustrated in FIG. 1B. Second portion 144 of polarization layer 140 has a non-zero thickness beneath the second gate portion 128 of gate stack 120. In an embodiment, second portion 144 of polarization layer 140 is sufficiently thick to create a 2DEG layer in the top surface of GaN layer 110 beneath second portion 128 of gate stack 120. In this way, the first portion 126 of gate stack 120 has a threshold voltage (VT1) which is greater than the threshold voltage (VT2) of the second gate portion 128 of gate stack 120. In an alternative embodiment, first portion 142 of polarization layer 140 has a zero thickness, and the second portion has a non-zero thickness, which is not sufficiently thick to create a 2DEG layer in GaN layer 110 beneath second gate portion 128 of gate stack 120. Although, a 2DEG is not formed beneath the second gate portion 128 of gate stack 120 in an embodiment, the second portion 128 of gate stack 120 may still have a lower threshold voltage (VT2) than the threshold voltage (VT1) of the first gate portion 126 of gate stack 120 disposed directly on GaN layer 110.

In the embodiment, the first portion 142 and the second portion 144 of polarization layer 140 both have a non-zero thickness. In an embodiment, the first portion 142 has a first non-zero thickness and a second portion 144 has a second non-zero thickness greater than the first thickness, wherein the first portion 142 is not sufficiently thick to create a 2DEG layer in GaN layer 110 beneath first gate portion 126 and wherein the second portion 144 of polarization layer 140 is also not sufficiently thick to create a 2DEG layer in GaN layer 110 beneath second gate portion 128. In yet another embodiment, the second portion 144 of polarization layer 140 is thicker than the first portion 142 of polarization layer 140 and the first portion 142 and the second portion 144 are each sufficiently thick to create a 2DEG layer in GaN layer 110 beneath first gate portion 126 and second gate portion 128, respectively. In an embodiment, the second portion 144 of polarization layer 140 is approximately 2-3 times thicker than the first portion 142 of polarization layer 140. In a specific embodiment, the first portion 142 of polarization layer 140 comprises a 1 nanometer AN layer on the GaN layer 110 and a 1 nanometer AlInN layer on the 1 nanometer AN layer, and the second portion 144 of polarization layer 140 comprises a 1 nanometer AN layer on the GaN layer 110 and a 3 nanometer AlInN layer on the 1 nanometer AN layer. In an embodiment, in either case, the AlInN layer comprises $Al_{0.83}In_{0.17}N$.

In another embodiment, first portion 142 of polarization layer 140 has a non-zero thickness that is insufficient to create a 2DEG layer in GaN layer 110 beneath first gate portion 126 and wherein the second portion 144 of polarization layer 140 has a thickness greater than the thickness of the first polarization layer 142 and is sufficient to create a 2DEG layer in GaN layer 110 beneath second gate portion 128.

It is to be appreciated, in embodiment of the present disclosure, polarization layer 140 may have a third portion beneath a third gate portion wherein the third portion of the polarization layer 140 has a thickness greater than the thickness of the second portion 144 of polarization layer 140 which is yet thicker than the first portion 142 of polarization layer 140. In this way, a transistor having three different threshold voltages may be obtained. A similar technique may be practiced to create a GaN transistor with four or more threshold voltages, if desired.

In an embodiment, transistor 100 includes a pair of insulative sidewall spacers 160 disposed on opposite sides of gate stack 120 as illustrated in FIGS. 1B and 1C. Sidewall spacers may be formed from any well-known material, such as but no limited to silicon oxide, silicon nitride, and silicon oxynitride. One of the sidewall spacers of the pair of sidewall spacers 160 is disposed on a source portion 146 of polarization layer 140 between gate stack 120 and source III-N semiconductor contact 134. The other sidewall spacer of the pair of sidewall spacers 160 is disposed on a drain portion 148 of polarization layer 140 disposed between gate stack 120 and drain III-N semiconductor contact 136. In an embodiment, source polarization layer 146 creates a 2DEG layer 150 in the top surface of GaN layer 110 and drain polarization layer 148 creates a 2DEG layer 150 in the top surface of GaN layer 110 as illustrated in FIGS. 1B and 1C. In embodiments of the present disclosure, source polarization layer 146 and drain polarization layer 148 have a thickness greater than the thickness of the second portion 144 of polarization layer 140 and greater than the thickness of the first portion 142 of polarization layer 140 which may be a zero thickness.

In an embodiment of the present disclosure, the first transistor portion 102 and the second transistor portion 104 have the same gate width. In other embodiments, the first transistor portion 102 has a greater or smaller gate width than second transistor portion 104. In this way, the amount of current provided by the first transistor portion may differ from the amount of current provided by the second transistor portion 104.

In embodiments of the present disclosure, isolation regions 170 may be formed in GaN layer 110. Isolation regions 170 may surround transistor 100 to isolate transistor 100 from other devices manufactured in GaN 110 and/or substrate 112. An interlayer dielectric 172, such as but not limited to, silicon dioxide and carbon doped silicon oxide, may be disposed over transistor 100. Contacts 174 and 176, such as metal contacts, may be disposed in dielectric 172 to create electrical contacts to source III-N semiconductor contact 134 and to drain III-N semiconductor contact 136, respectively, as illustrated in FIGS. 1B and 1C.

Figure 2:
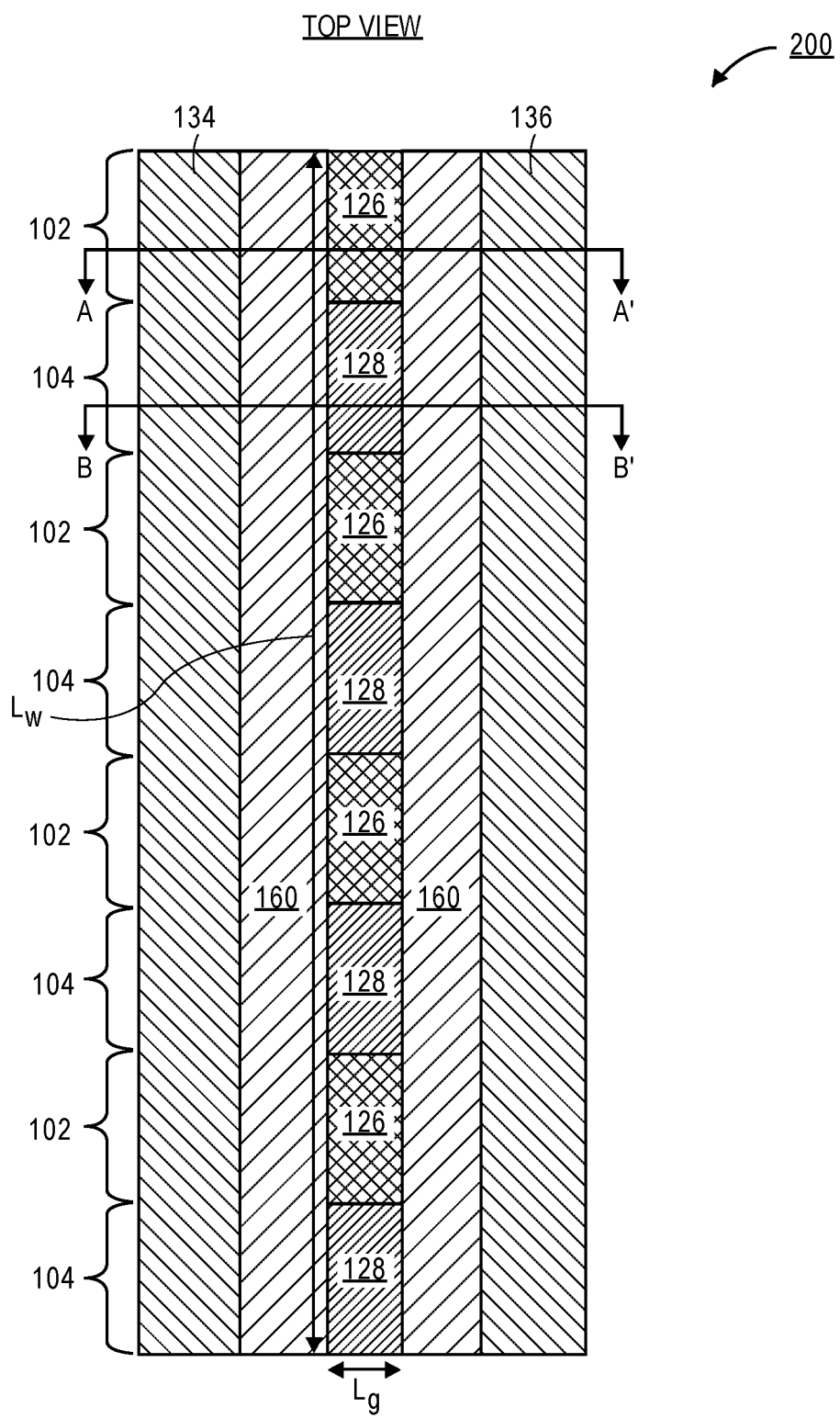
FIG. 2 illustrates a GaN transistor having multiple threshold voltages in accordance with an embodiment of the present disclosure.

FIG. 2 illustrates a GaN transistor 200 having multiple threshold voltages in accordance with an embodiment of the present disclosure. GaN transistor 200 includes a plurality of first transistor portions 102 and a plurality of second transistor portions 104 along the gate width (Gw) direction of transistor 200 as illustrated in FIG. 2. Each of the first transistor portions 102 and each of the second transistor portions 104 may include transistor structures as illustrated and described with respect to FIGS. 1B and 1C, respectively. That is, in an embodiment, each first transistor portion 102 of the plurality of first transistor portions includes a first portion 142 of polarization layer 140 having a first thickness, including possibly a zero thickness, and each second transistor portion 104 of the plurality of second transistor portions includes a second portion 144 of polarization layer 140 having a second thickness wherein the second thickness is greater than the first thickness. In an embodiment, the first transistor portions 102 and the second transistor portions 104 of GaN transistor 200 alternate or interleave with one another along the gate width (Gw) direction of FIG. 2. In an embodiment, transistor 200 includes two first transistor portions 102 and two second transistor portion 104. In another embodiment, transistor 200 includes three first transistor portions 102 and three second transistor portions 104. In yet another embodiment, transistor 200 includes three or more first transistors portions 102 and three or more second transistor portions 104. In embodiments, transistor 200 has more first transistor portions 102 than second transistor portions 104. In yet embodiment, transistor 200 has more second transistor portions 104 than first transistor portions 102. In an embodiment, interleaving provides a plurality of parallel channels for transistor 200.

Figure 3:
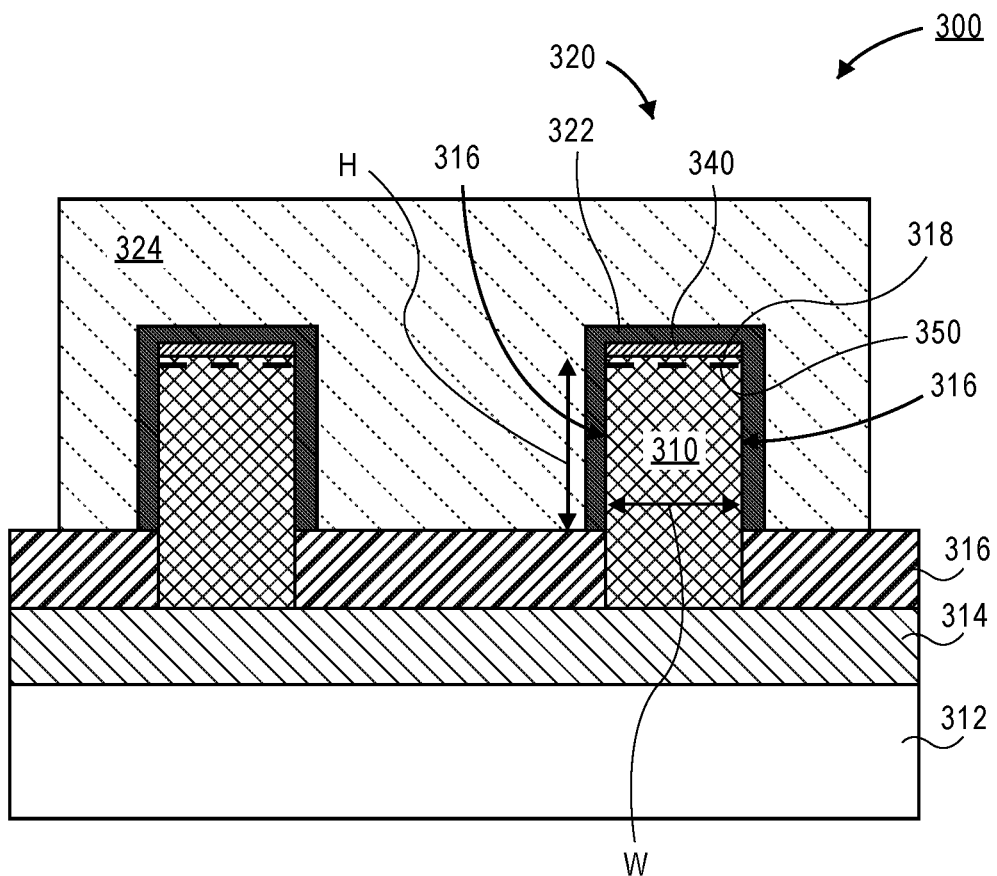
FIG. 3 illustrates a cross-sectional view of a nonplanar or tri-gate GaN transistor having multiple threshold voltages in accordance with embodiments of the present disclosure.

FIG. 3 illustrates a cross-sectional view of a nonplanar or tri-gate GaN transistor 300 having multiple threshold voltages in accordance with embodiments of the present disclosure. Transistor 300 includes a GaN fin 310 disposed above a substrate, such as but not limited to a monocrystalline silicon substrate, silicon carbide substrate, or an aluminum oxide substrate. A buffer layer 314 may be disposed between GaN fin 310 and substrate 312. Fin 310 has a pair of laterally opposite sidewalls 316 and a top surface 318 between the laterally opposite sidewalls. In an embodiment, top surface 318 of GaN fin 310 is a (1000) plane or a c-plane of GaN. An oxide layer, such as an oxide of a shallow trench isolation (STI) may be disposed above substrate 312 and may surround a bottom portion of fin 310, so that an upper portion of fin 310 extends above oxide 316 as illustrated in FIG. 3.

A polarization layer 340 is disposed on the top surface 318 of fin 310. In an embodiment, polarization layer 310 is a III-N semiconductor material, such as but not limited to AlGaInN, AlGaN, and AlInN. In an embodiment polarization layer 340 is not formed on sidewall 316 of fin 310. A gate stack 320 is disposed over polarization layer 320 on the top surface 318 of fin 310 and is disposed over the sidewalls 316 of fin 310 as illustrated in FIG. 3C. Gate stack 320 may include a gate dielectric 322, such as but not limited to hafnium oxide (e.g. $HfO_2$) or aluminum oxide (e.g. $Al_2O_3$) and a gate electrode 324 such as a metal gate electrode. Gate dielectric 322 may be disposed between gate electrode 324 and sidewalls 316 of gate electrode 324 and between gate electrode 324 and polarization layer 340 on the top surface of GaN fin 310. A source region and a drain region (not shown) may be disposed on opposite sides (into and out of the page) of the gate stack 320 as is well-known in the art.

The source and drain regions each may include a group III-N semiconductor contact, such as but not limited to InGaN.

In an embodiment, polarization layer 340 is of a sufficient thickness to create a 2DEG layer in the top surface of fin 310 as illustrated in FIG. 3. In an alternative embodiment, polarization layer 340 has a thickness which is insufficient to create a 2DEG layer in the top surface of fin 310, however, is of a sufficient thickness in order to provide a different threshold voltage for the portion of the gate stack 320 over the top surface 318 of fin 310 relative to the threshold voltage of the gate stack 320 adjacent to the sidewalls 316 of fin 310. In either case, transistor 300 has two different threshold voltages, a first threshold voltage (VT1) associated with a portion of the gate stack 320 over/adjacent to the sidewalls 316 of fin 310 and second threshold voltage (VT2), such as a lower threshold voltage, associated with the portion of the gate stack 320 over polarization layer 340 and top surface 318 of fin 310. The width (W) of and the height (H) of the portion of fin 310 may be chosen to create the desired amount of current provided by the top surface 318 of fin 310 relative to the sidewalls 316 of fin 310. In an embodiment, an additional fin or fins including a top polarization layer may be included to increase the current carrying capability of transistor 300, an example of which is shown in FIG. 3.

Figure 4A:
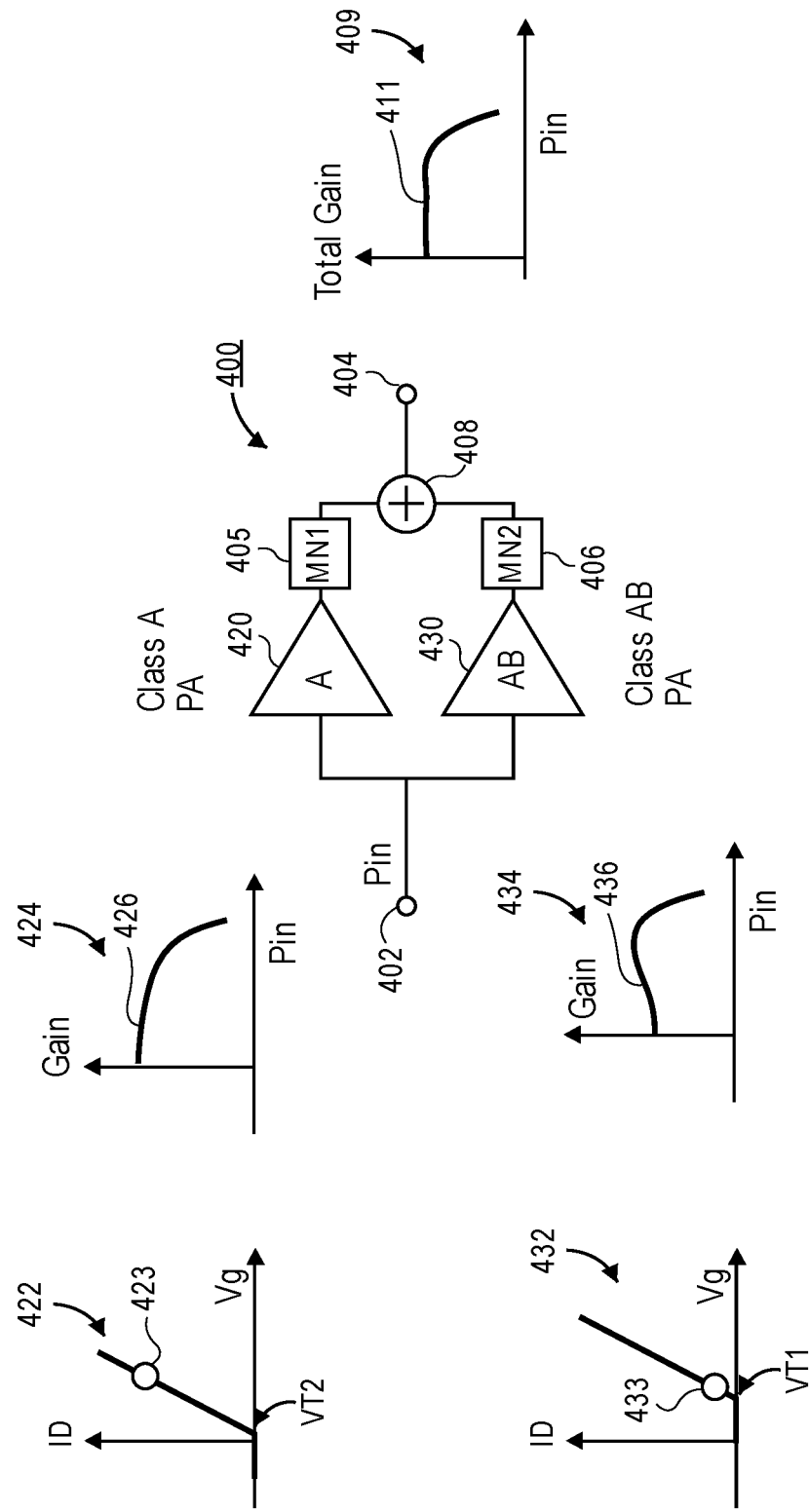
FIG. 4A illustrates a power amplifier (PA) circuit which has improved linearity.

FIG. 4A illustrates a power amplifier (PA) circuit 400 having improved linearity. PA circuit has an input node 402 and an output node 404. PA circuit 400 has a class A PA 420 having an input coupled to input node 402 and an output coupled to an input of a first matching network 405. PA circuit 400 has a Class AB PA 430 having an input coupled to input node 402 and an output coupled to an input of a second matching network 406. An output of first matching network 405 is coupled to a first input of a power combiner 408. An output combiner 408 is coupled to output node 404 of power amplifier circuit 400. An output of second matching network 406 is coupled to a second input of power combiner 408. Power amplifier circuit 400 has a gain curve as illustrated in plot 409. As shown in plot 409, the gain curve has a linear portion 411.

Class A PA 420 includes a transistor having a drain current/gate voltage (ID/VG) curve and a threshold voltage (VT2) as illustrated in plot 422. The transistor of Class A PA 420 may be biased to operate at a point 423 of the ID/VG curve of plot 422. The transistor of Class A PA may have a gate coupled to input node 402 and a drain coupled to the input of first matching network 405. Class A PA may have a gain curve as illustrated in plot 424. As shown in plot 424 the gain curve has a non-linear negative sloping portion 426.

The Class AB PA 430 includes a transistor having a drain current/gate voltage (ID/VG) curve and threshold voltage (VT1) as illustrated in plot 432. The transistor of Class AB PA 430 may be biased to operate at a point 433 of the ID/VG of plot 432. The transistor of Class AB PA 430 may have a gate coupled to gate input node 402 and a drain coupled to the input of second matching network 406. Class AB PA 430 may have a gain curve as illustrated in plot 434. The gain curve has a non-linear positive sloping portion 436. The threshold voltage VT1 of the transistor of Class AB PA is greater than the threshold voltage VT2 of the Class A PA 430 as illustrated in plot 432 and 422, respectively.

Amplifier circuit 400 has improved linearity as illustrated by linear portion 411 of plot 409 compared to the non-linear portions 426 and 436 of the gain curves in plots 424 and 434, respectively. Unfortunately, circuit 400 requires two discrete PAs and, as a result, two separate matching networks and an additional external power combiner all of which result in an inherent power loss.

Figure 4B:
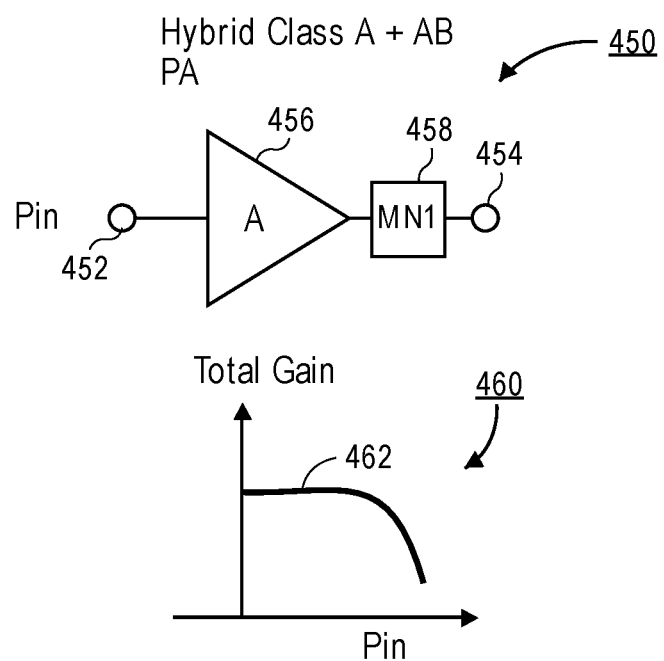
FIG. 4B illustrates a hybrid Class A+AB power amplifier (PA) circuit in accordance with embodiments of the present disclosure.

FIG. 4B illustrates a hybrid Class A+AB power amplifier (PA) circuit 450 in accordance with embodiments of the present disclosure. Hybrid Class A+AB PA 450 has an input 452 and an output 454. The input 452 is coupled to an input of a power amplifier 456. An output of power amplifier 456 is coupled to an input of a matching network 458. An output of matching network 458 is coupled to the output node 454 of circuit 450. Power amplifier 456 may include a GaN transistor with two or more threshold voltages, such as but not limited to transistor 100, transistor 200 or transistor 300 described herein. A gate of the transistor in amplifier 456 may be coupled to the input node 452 and a drain may be coupled to the input of matching network 458. The transistor of PA 456 may have a first portion, such as first portion 102 illustrated in FIG. 1B and a second portion, such as portion 104 illustrated in FIG. 1C. The first portion may have a threshold voltage (VT1) and an ID/VG curve as illustrated in plot 432 and may have a gain curve as illustrated in plot 434. The second portion of the transistor of PA 456 may have a threshold voltage VT2 and an ID/VG curve as illustrated in plot 422 of FIG. 4A and may have a gain curve as illustrated in plot 426 of FIG. 4A.

Power amplifier circuit 450 may have a gain curve as illustrated in plot 460 of FIG. 4B. The gain curve of plot 460 has a linear portion 462. Accordingly, a GaN transistor having multiple threshold voltages in accordance with embodiments of the present disclosure, may be used to create an amplifier circuit having improved linearity while only requiring a single PA and a single matching network and without requiring a power combiner.

FIGS. 5A-5H illustrate cross-sectional views of a method of fabricating a GaN transistor having multiple threshold voltages in accordance with embodiments of the present disclosure.

Figure 5A:
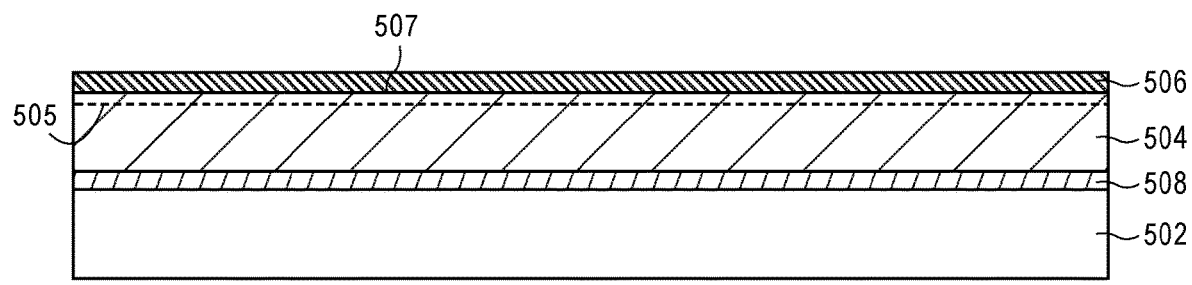

FIG. 5A illustrates a GaN layer 504 formed over a substrate 502. A polarization layer 506 may be disposed on the GaN layer 504. In an embodiment, the top surface 507 of GaN layer 204 is a (0001) plane or a c-plane of GaN. GaN layer 504 may have a thickness between 1-2 microns. Substrate 502 may be any well-known substrate used in the manufacture of integrated circuits, such as but not limited to a silicon monocrystalline substrate, a silicon carbide substrate and a sapphire substrate. In an embodiment, a buffer layer 506 may be formed between substrate 502 and GaN layer 504. Buffer layer 206 may contain one or more layers having a lattice constant between the lattice constant of substrate 502 and GaN layer 504. Polarization layer 506 is a III-N semiconductor, such as but not limited to aluminum gallium indium nitride ($Al_xGa_{1-x-y}In_yN$, where $0<x<=1$, $0<y<=1$) which is formed to a sufficient thickness to create a two dimensional electron gas (2-DEG) layer 505 in the top portion of GaN layer 504. In an embodiment, polarization layer 506 consists of multiple layers, such as AlN/$Al_{0.2}Ga_{0.8}N/Al_{0.83}In_{0.17}N$, where the AN is to the bottom-most layer. In an embodiment, the polarization layer 506 has a thickness of approximately 10 nanometers.

In a specific embodiment, substrate 502 is a monocrystalline silicon substrate, buffer layer 508 includes an aluminum nitride layer having a thickness between 100-300 nm disposed on the monocrystalline silicon substrate and a graded aluminum gallium nitride layer with a higher aluminum concentration near the aluminum nitride layer. Integrated circuits, for example, a system-on-chip (SOC) or a microprocessor, may be formed from silicon transistors, such as nonplanar transistors, fabricated on portions of silicon substrate 502 not covered by the GaN layer 504. In another embodiment, substrate 502 is a silicon carbide (SiC) substrate and buffer layer 508 comprises aluminum nitride having a thickness, for example, between 100-300 nm. Polarization layer 506, buffer layer 508, GaN layer 504 may be formed by any well-known technique, such as but not limited to chemical vapor deposition (CVD), metal organic chemical vapor deposition (MOCVD), and sputtering.

Figure 5B:
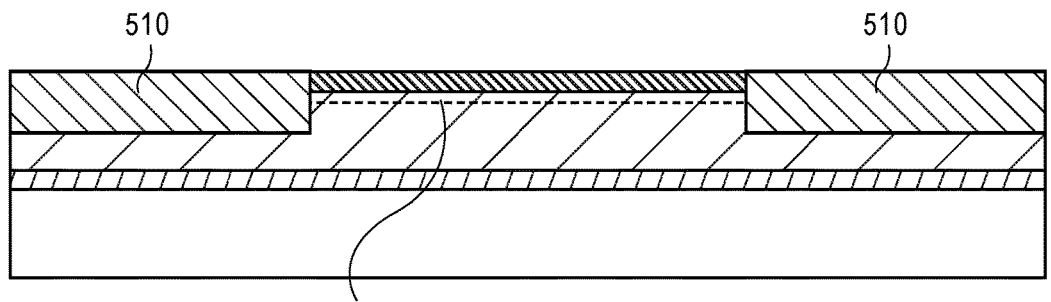

FIG. 5B illustrates the formation of shallow trench isolation (STI) regions 510 in the structure of FIG. 5A. STI regions 510 may be formed by etching trenches through polarization layer 506 and into GaN layer 504 and the blanket depositing an insulating film, such as silicon oxide, to fill the trenches. A chemical mechanical polishing (CMP) process may then be used to remove excess insulating material, such as silicon oxide, from above polarization layer 506 so that STI regions 510 are substantially coplanar with the top surface of polarization layer 506 as shown in FIG. 5B.

Figure 5C:
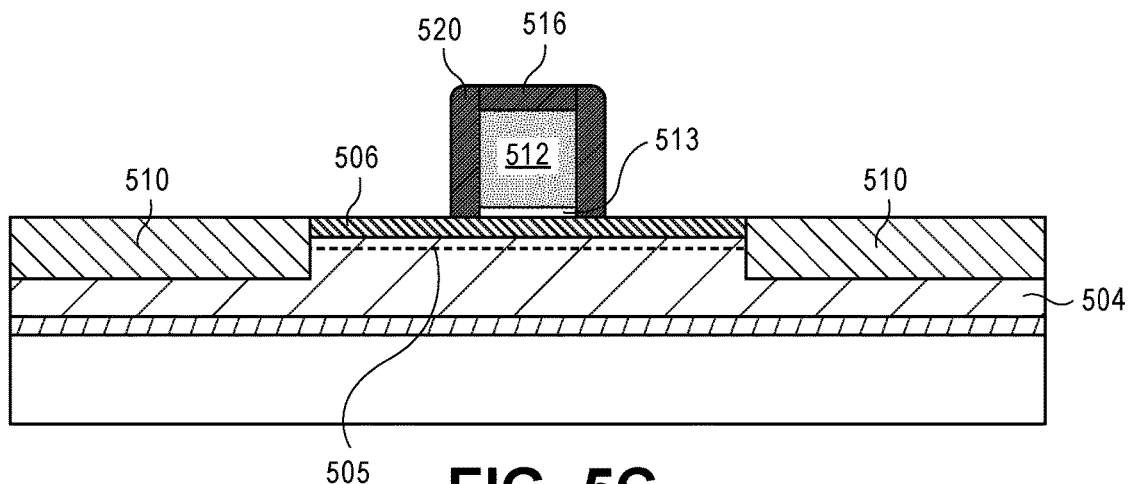

FIG. 5C illustrates the formation of a sacrificial gate 512 on the structure of FIG. 5B. A sacrificial gate dielectric 513, such as silicon dioxide, may be formed beneath sacrificial gate 512 if desired. A hard mask cap 516 may be formed on the top of sacrificial gate 512 as shown in FIG. 5C. A pair of insulating sidewall spacers 520 may be formed along opposite walls of sacrificial gate 512 as shown in FIG. 5C.

Sacrificial gate 512/cap 516 may be formed by first blanket depositing a polycrystalline film, such as but not limited to polycrystalline silicon by, for example, chemical vapor deposition (CVD) or sputtering over the structure of FIG. 5B. A hard mask capping layer, such as but not limited to silicon nitride, silicon carbide, or silicon oxynitride may be deposited over the polycrystalline film. The stack of films can then be patterned by well-known techniques, such as by lithographic masking and etching to form sacrificial gate 512/cap 516. Insulating sidewall spacers 520 may then be formed by blanket depositing an insulating film, such as but not limited to silicon oxide, silicon oxynitride, and silicon nitride over sacrificial gate 512/cap 516 and then anisotropically etching the insulating film to form spacers, as is well-known in the art.

Figure 5D:
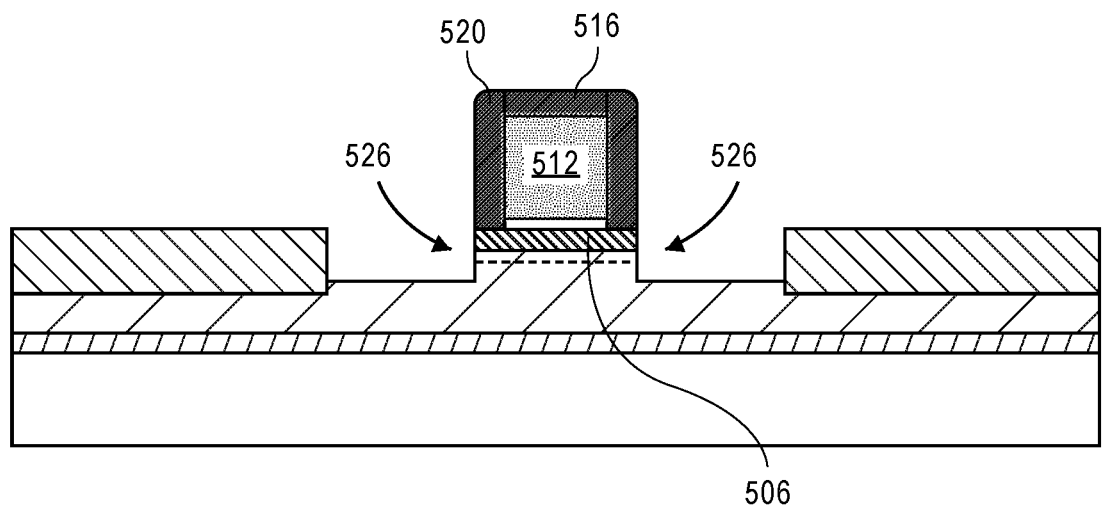

FIG. 5D illustrates the formation of recesses in the structure of FIG. 5C. In an embodiment, recesses 526 are formed on opposite sides of sacrificial gate 512 as illustrated in FIG. 5D. Recesses 526 are formed through polarization layer 506 and into GaN layer 504. Recess 526 may enable a subsequently deposited source/drain material to provide stressing to a channel region of a fabricated transistor. Recesses 526 may be formed by wet etching, dry etching or a combination of wet and dry etching.

Figure 5E:
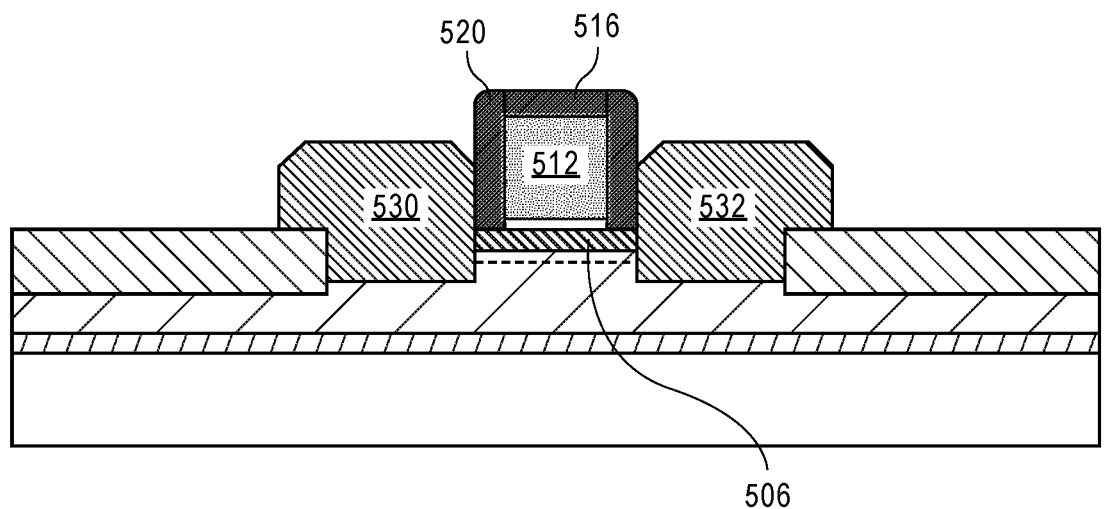

FIG. 5E is a cross-sectional view illustrating the formation of a source semiconductor contact region, and drain semiconductor contact region on the structure of FIG. 5D. In an embodiment, a source semiconductor contact 530 is formed in recess 526 on a first side a sacrificial gate 512 and a drain semiconductor contact 532 is formed in recess 526 on a second side of sacrificial gate 512 as illustrated in FIG. 5E. In an embodiment, source semiconductor contact 530 and drain semiconductor contact 532 are formed from a III-N semiconductor, such as but not limited to indium gallium nitride (InGaN). In an embodiment, source semiconductor contact 530 and drain semiconductor contact 532, are formed from a III-N semiconductor material which is different from a GaN layer 504. In an embodiment, the III-N semiconductor material used to form source semiconductor contact 530 and drain semiconductor contact 532 has a smaller band gap than GaN. In an embodiment, the source semiconductor contact 530 and drain semiconductor contact 532 are formed from a single crystalline III-N semiconductor and may be N+ doped with a dopant such as silicon. In an embodiment, a III-N semiconductor material is selectively deposited by, for example, chemical vapor deposition so that the III-V semiconductor material selectively forms on semiconductor regions, such as GaN semiconductor layer 504 in recesses 526 but does not form on insulating surfaces, such as STI oxide 510 and hard mask cap 516. In an embodiment, the deposition process is continued until recesses 526 are completely filled with III-N semiconductor material.

Additionally, in an embodiment of the present disclosure, the deposition process continues until the top surface of source semiconductor contact 530 and drain semiconductor contact 532 extend above the surface upon which sacrificial gate 512 is formed in order to create a raised source region 530 and a raised drain region 532, which may be in situ doped with for example silicon to N+ conductivity. In an embodiment, the deposition process used to form source semiconductor contact 530 and drain semiconductor contact 532 selectively epitaxially deposits a single crystalline or near single crystalline film.

Figure 5F:
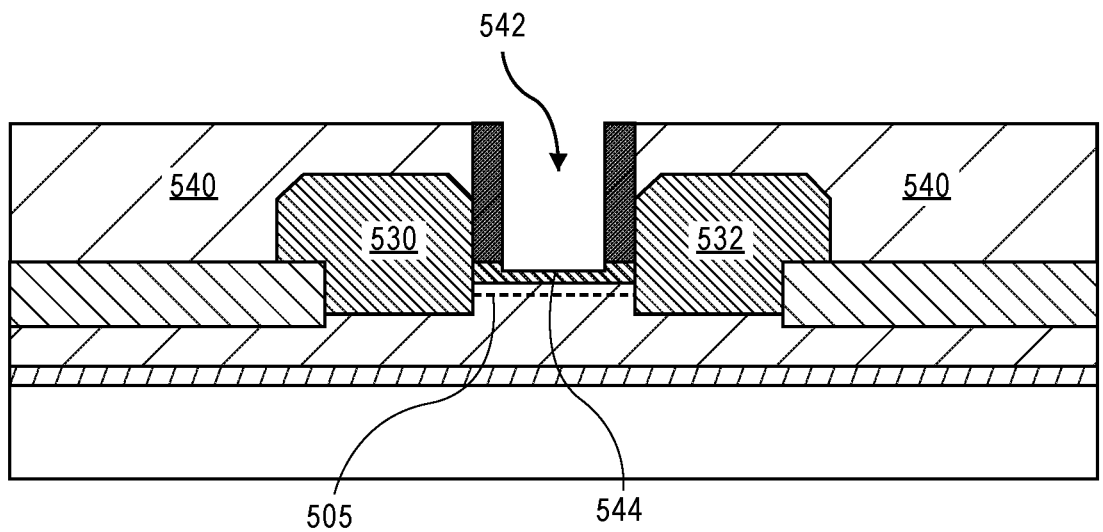

FIG. 5F illustrates the formation of an interlayer dielectric over the structure of FIG. 5E and the removal of cap 516 and sacrificial gate structure 512 from the structure of FIG. 5E. In an embodiment, an interlayer dielectric (ILD) 540 is first blanket deposited over the structure of FIG. 5E. The interlayer dielectric 540 may be deposited by any well-known technique, such as for example, chemical vapor deposition or plasma enhanced chemical vapor deposition. In an embodiment, the interlayer dielectric 540 is an oxide, such as but not limited to, silicon oxide, and carbon doped silicon oxide. The ILD 540 is deposited to a thickness sufficiently to cover source semiconductor contact 530 and drain semiconductor contact 532. The ILD 540 may then be chemically mechanically polished in order to create a planar top surface which is coplanar with the top of hard mask cap 516. Cap 516 and sacrificial gate 512 may then be removed by, for example, etching as illustrated in FIG. 5F. In an embodiment, the entire polarization 506 layer in the opening 542 is then partially etched a first time to create a recessed polarization layer 544 having a first thickness. In an embodiment the first thickness is sufficient to maintain the 2DEG layer 505 in the top of GaN layer 504 as illustrated in FIG. 5F. In an embodiment, recessed polarization layer 544 has a thickness of approximately 4 nanometers.

Figure 5G:
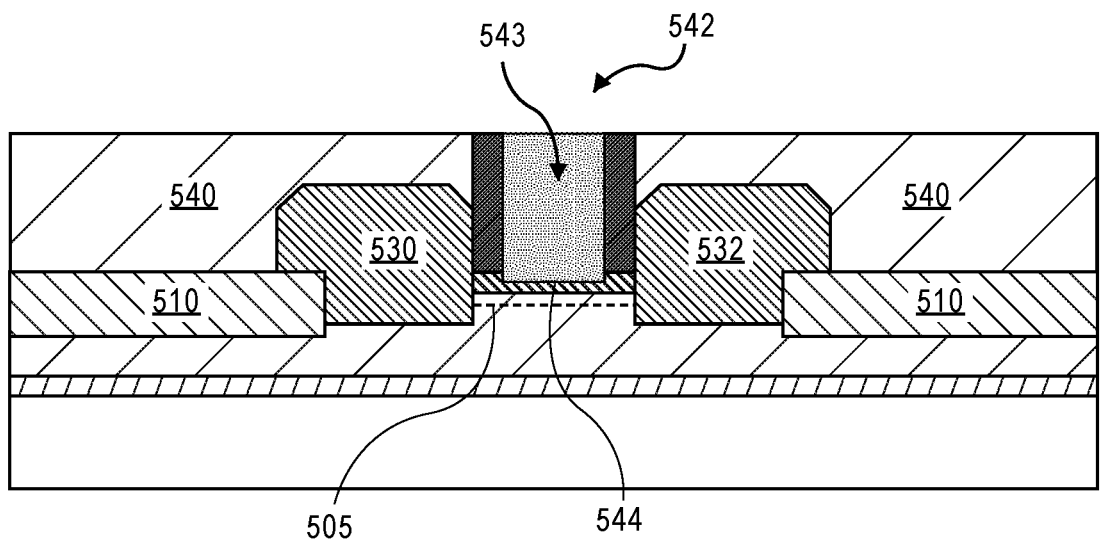

Next, as illustrated in FIG. 5G, opening 542 is filled with an insulating material 543, such as but not limited to a sacrificial light absorbing material (SLAM). Opening 542 may be filled by blanket depositing insulating (sacrificial) material 543 over the structure of FIG. 5F, by for example spin coating and then removing the over burden, by for example, chemical mechanical polishing so that the top surface of insulating material 543 is coplanar with the top surface of interlayer dielectric 540 as shown in FIG. 5G.

Figure 5H:
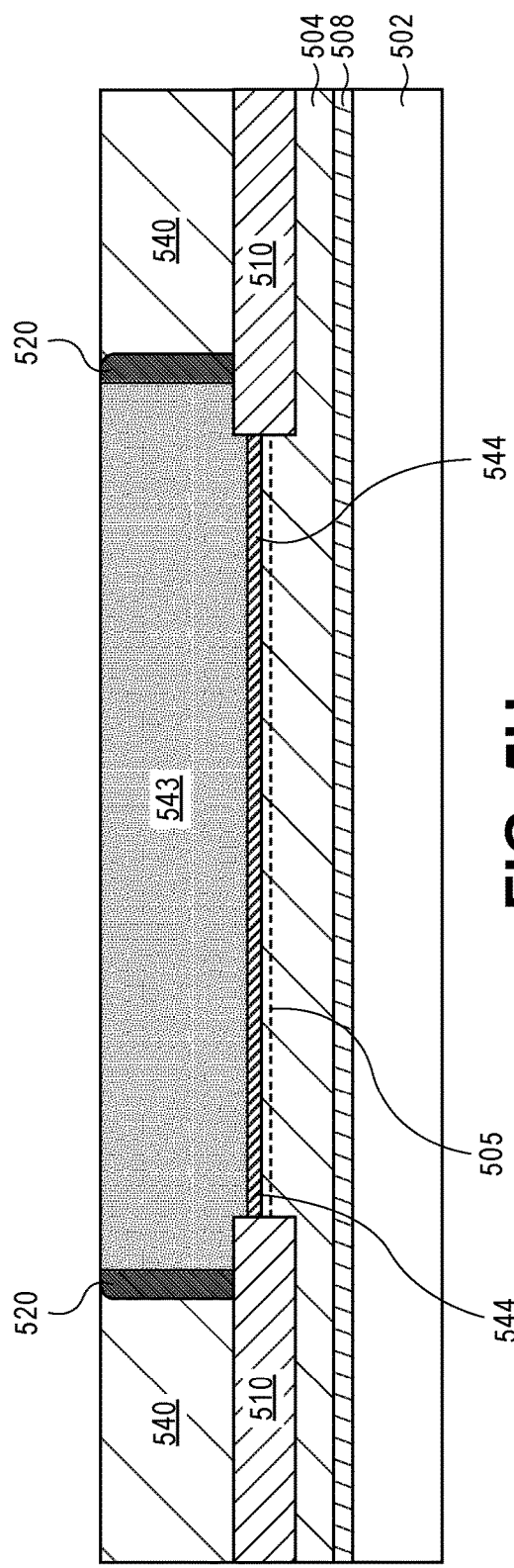

FIG. 5H is a cross-sectional illustration of FIG. 5G taken along the gate width direction. FIG. 5H shows insulating material 543 disposed on recessed polarization layer 544 having a first thickness. In an embodiment, the top surface of recessed polarization layer 544 may be slightly recessed beneath the top surface of STI 510 as illustrated in FIG. 5H.

Figure 5I:
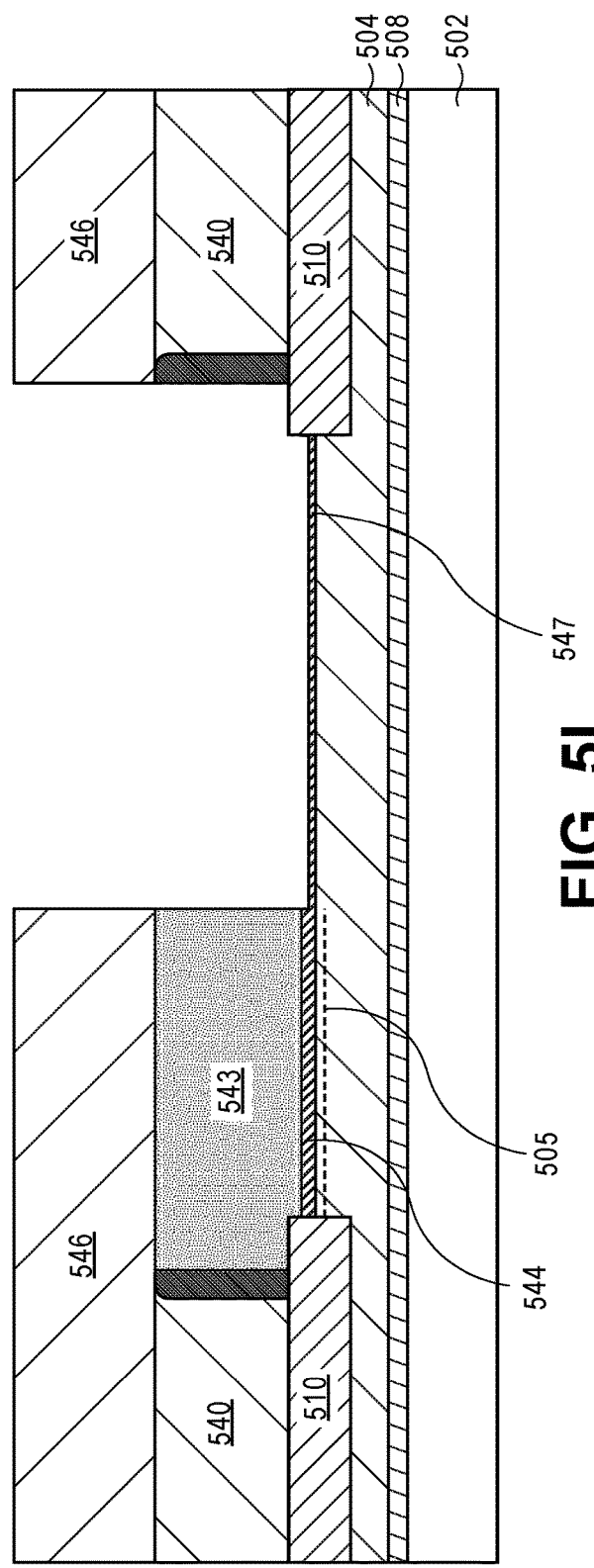

FIG. 5I illustrates a second etching of a portion 547 of recessed polarization layer 544 of the structure of FIG. 5H. In an embodiment, a photoresist mask 546 is formed on a portion of insulating material 543. Photoresist mask 546 has an opening over a portion 547 of recessed polarization layer 544. The portion of insulating layer 543 beneath opening 548 is then removed, by, for example, wet etching. Next, the exposed portion of recessed polarization layer 544 is etched a second time, for example, by wet etching to create a polarization portion 547 having a second thickness which is less than the thickness of the recess polarization layer. In an embodiment, the second thickness of portion 547 of polarization layer is insufficient to create a 2DEG layer in GaN layer 504 as illustrated in FIG. 5I. In an embodiment, polarization layer 547 has a thickness of approximately 2 nanometers. In another embodiment, the polarization layer in opening 548 is completely removed.

FIGS. 5I and 5K are views orthogonal to one another illustrating the formation of a gate on the structure of FIG. 5I subsequent to re-opening the entire gate region 542. In an embodiment of the present disclosure, the gate stack 550 is disposed in opening 542. In an embodiment of the present disclosure, gate stack 550 includes a high-k gate dielectric 552 disposed on recessed polarization layer 544 or on GaN layer 504 if polarization layer is completely removed during etching. Gate stack 550 includes a metal gate 554. In an embodiment, metal gate 554 includes a work function layer or layers 556 and a fill layer 558. At the time the process of fabricating a III-V transistor 560 in accordance with embodiments of the present invention is not complete. In an alternative embodiment, the first partial etching of polarization layer 506 creates a recess polarization layer 544 which is not sufficiently thick to create a 2DEG layer in the top of GaN layer 504.

FIGS. 6A-6E illustrate cross-sectional views and an angled three-dimensional view of a method of fabricating a GaN transistor having multiple threshold voltage in accordance with embodiments of the present disclosure.

Figure 6A:
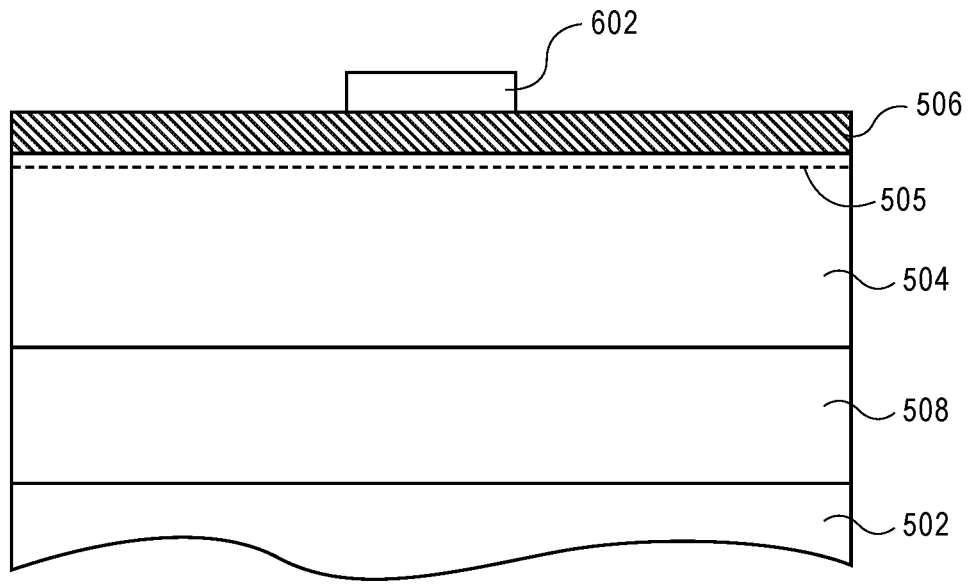
FIGS. 6A-6E illustrate cross-sectional views and an angled three-dimensional view of a method of fabricating a GaN transistor having multiple threshold voltages in accordance with embodiments of the present disclosure.

FIG. 6A illustrates a starting stack of materials includes a polarization layer 506 on a GaN layer 504 on a buffer layer 508 on a substrate 502, as discussed with respect to FIG. 5. In an embodiment, polarization layer 506 creates a 2DEG layer at the top surface of GaN layer 504. A mask 602 is formed on the polarization layer 506 to define a desired location for a fin.

Figure 6B:
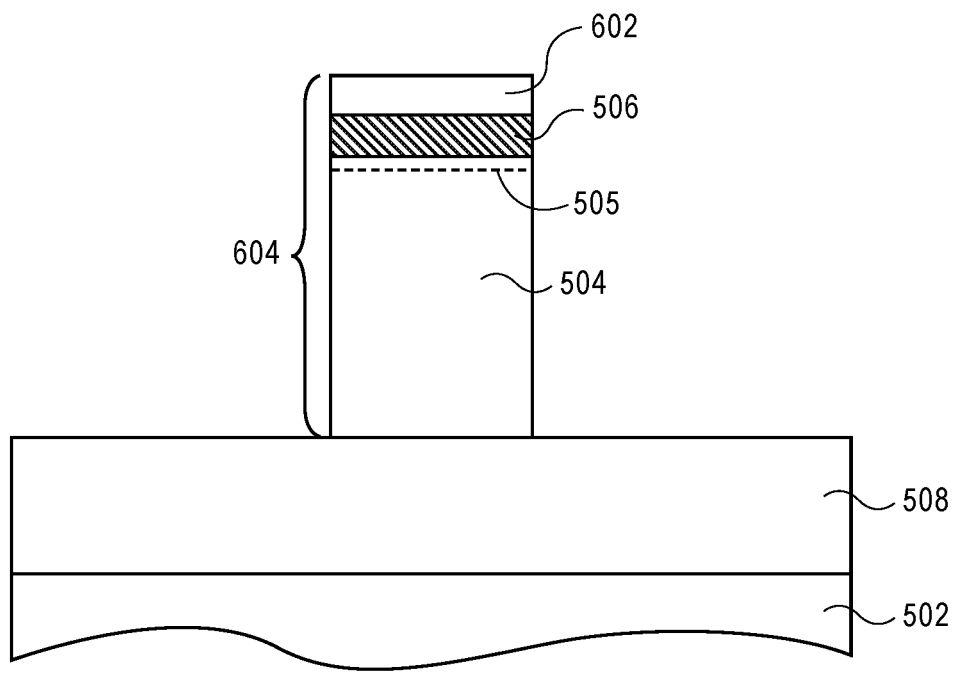

FIG. 6B illustrates the structure of FIG. 6A following of a fin 604, e.g., by etching the material stack of FIG. 6A in alignment with the mask 602.

Figure 6C:
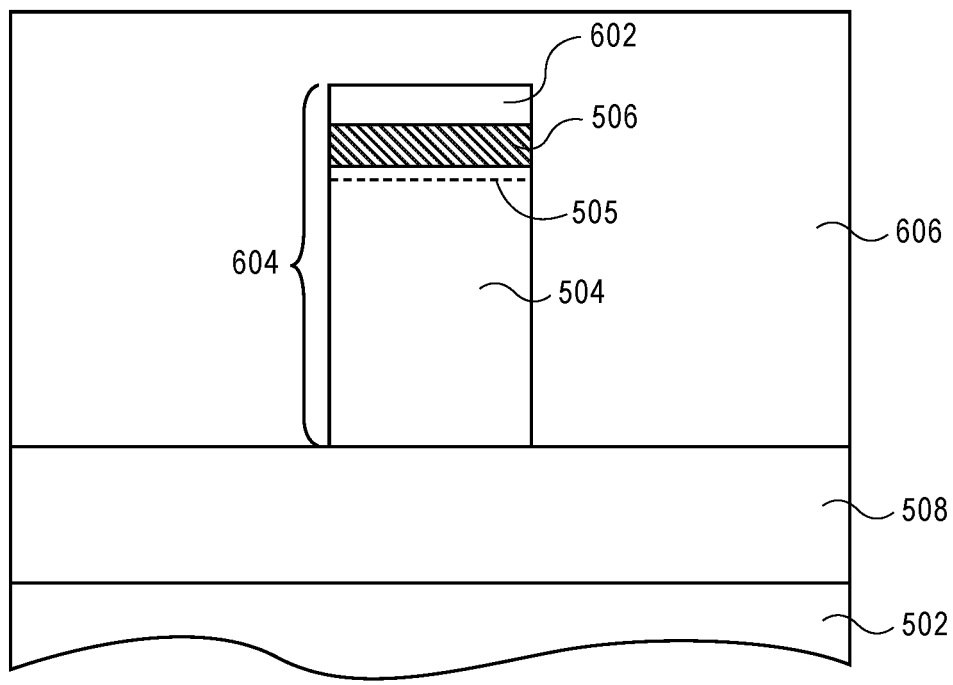

FIG. 6C illustrates the formation of an insulation material 606, such as a silicon oxide, over the structure of FIG. 6B.

Figure 6D:
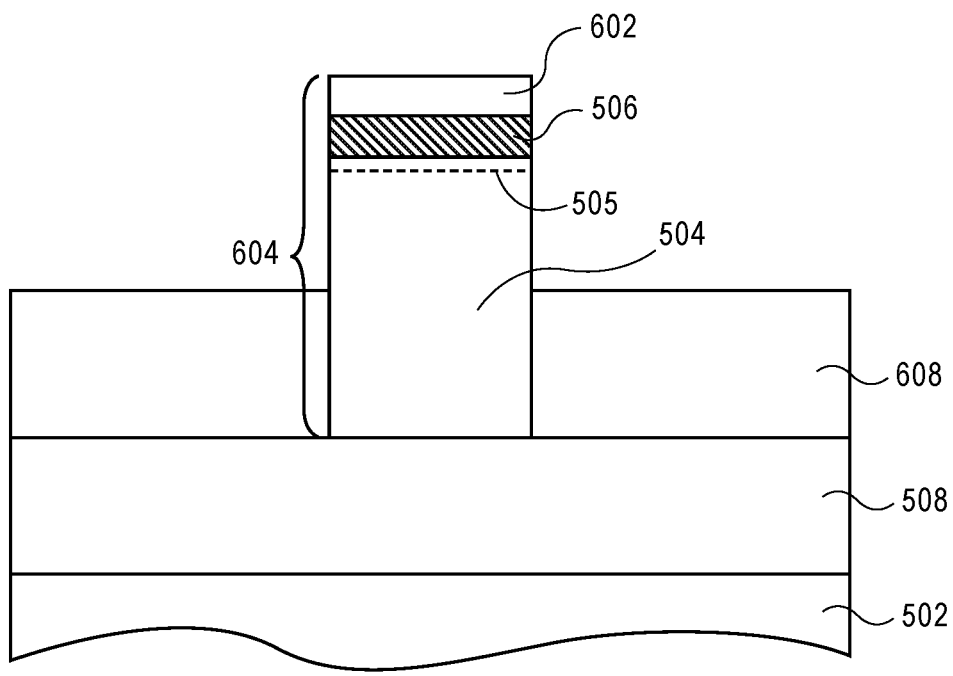

FIG. 6D shows the structure of FIG. 6C following recessing of the insulation material 606 to form an isolation region 608 and to expose an upper portion of the fin 604.

Figure 6E:
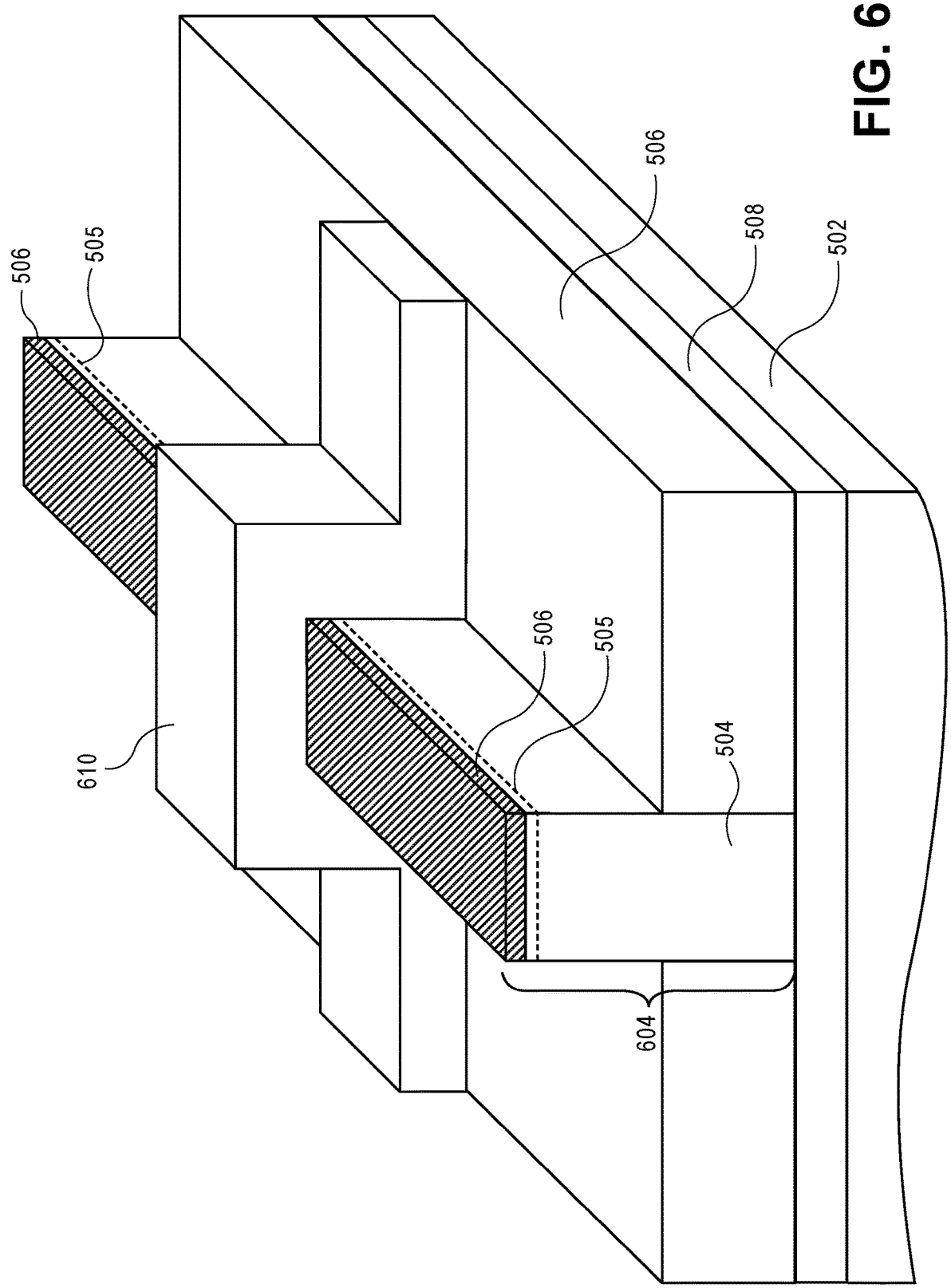

FIG. 6E illustrates the formation of a gate stack 610 over the sidewalls and top surface of a portion of the fin 604. A source and a drain region are formed on opposite sides of the gate stack 610. In an embodiment, the source and the drain portions of the fin 604 may be removed and replaced with an epitaxial semiconductor material.

Implementations of embodiments of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 7:
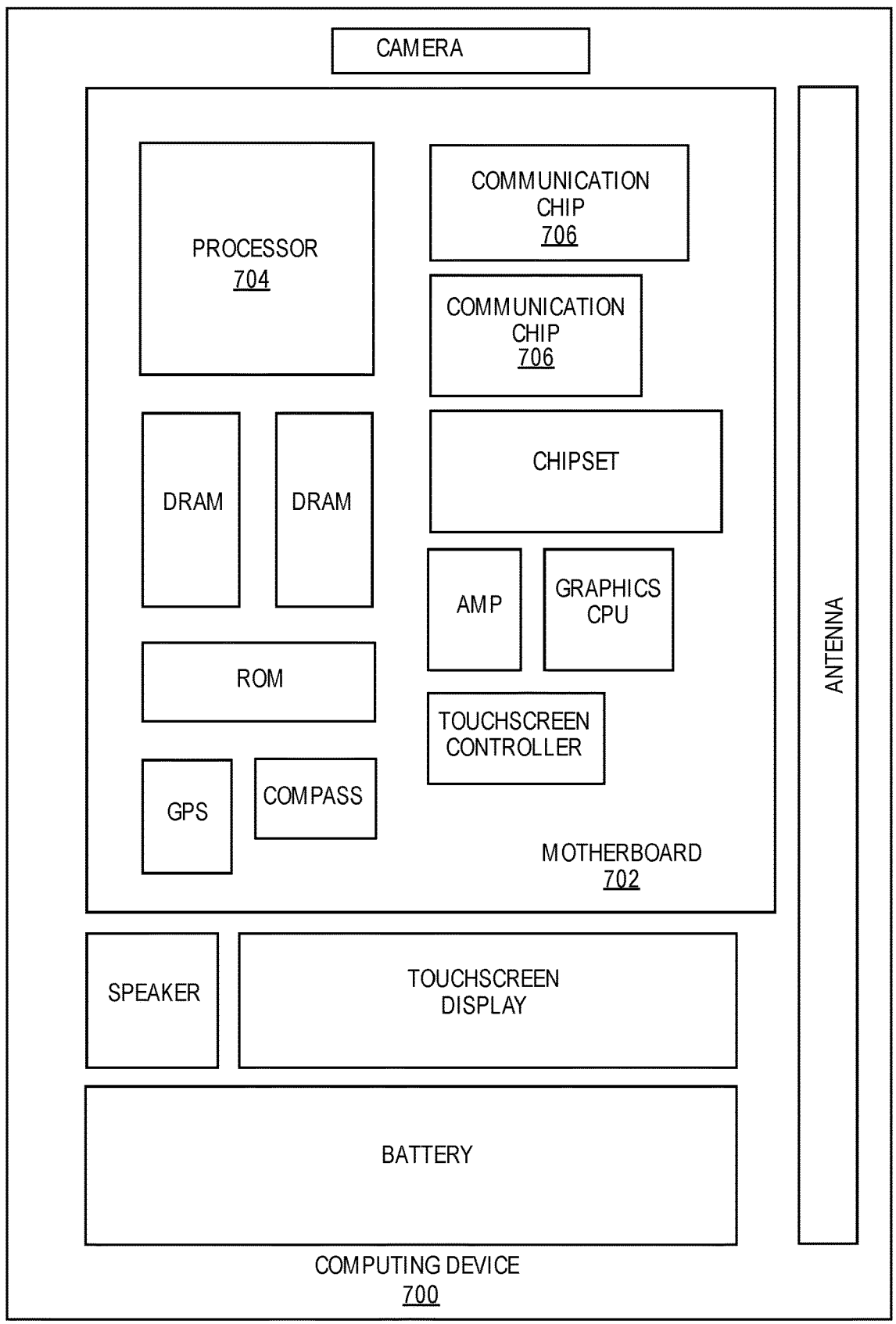
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the disclosure, the integrated circuit die of the processor includes one or more devices, such as gallium nitride (GaN) transistors having multiple threshold voltages built in accordance with implementations of the disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the disclosure, the integrated circuit die of the communication chip includes one or more devices, such as gallium nitride (GaN) transistors having multiple threshold voltages built in accordance with implementations of the disclosure.

In further implementations, another component housed within the computing device 700 may contain an integrated circuit die that includes one or more devices, such as gallium nitride (GaN) transistors having multiple threshold voltages built in accordance with implementations of the disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
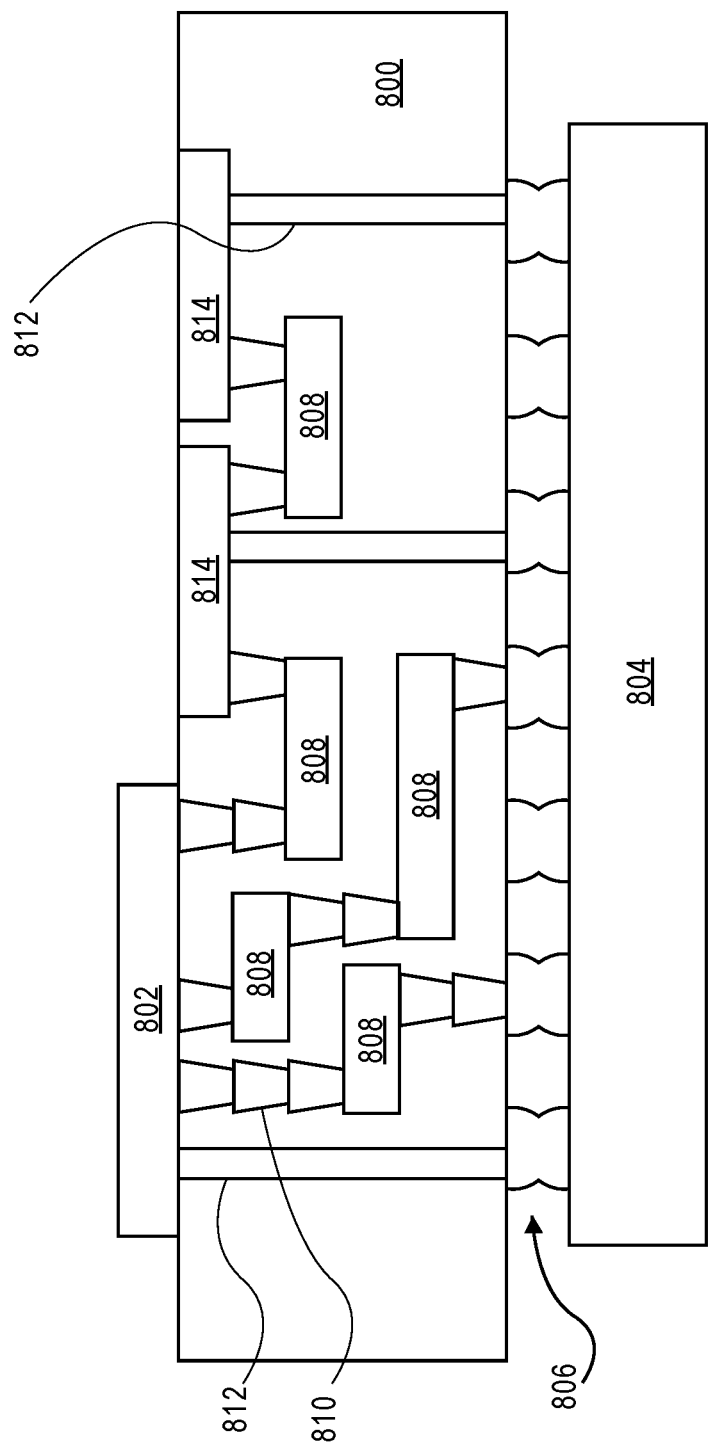
FIG. 8 illustrates an interposer that includes one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments described herein include group III-V semiconductor fuses and their methods of fabrication.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A transistor includes a gallium nitride layer over a substrate, a gate stack over the gallium nitride layer, a source region on a first side of the gate stack, and a drain region on a second side of the gate stack, the second side opposite the first side, wherein the gate stack has a gate length in a first direction extending from the source region to the drain region, the gate stack having a gate width in a second direction perpendicular to the first direction and parallel to the source region and the drain region. The transistor also includes a polarization layer beneath the gate stack and on the GaN layer, the polarization layer having a first portion having a first thickness under a first gate portion of the gate stack, the polarization layer having a second portion having a second thickness under a second gate portion of the gate stack, the first gate portion along a first portion of the gate width and the second gate portion along a second portion of the gate width, wherein the second thickness is greater than the first thickness.

Example embodiment 2: The transistor of example embodiment 1 wherein the first thickness is a zero thickness.

Example embodiment 3: The transistor of example embodiment 1 wherein the first thickness is a non-zero thickness.

Example embodiment 4: The transistor of example embodiment 1, 2 or 3 wherein the second thickness is sufficiently thicker compared to the first thickness such that the transistor has a first threshold voltage for the first gate portion and a second threshold voltage for the second gate portion, wherein the first threshold voltage is greater than the second threshold voltage.

Example embodiment 5: The transistor of example embodiment 1, 2, 3 or 4 wherein the gate stack comprises a gate dielectric above the GaN layer and a gate electrode on the gate dielectric.

Example embodiment 6: The transistor of example embodiment 1, 2, 3, 4 or 5 wherein the polarization layer comprises: aluminum, indium and nitrogen.

Example embodiment 7: The transistor of example embodiment 6 wherein the polarization layer comprises: a first layer comprising aluminum and nitride, a second layer on the first layer, the second layer comprising aluminum, gallium and nitrogen, and a third layer on the second layer, the third layer comprising aluminum, indium and nitrogen.

Example embodiment 8: The transistor of example embodiment 1, 2, 3, 4 or 5 wherein the first portion of the polarization layer comprises a first layer comprising AlN and a second layer comprising AlInN and wherein the second portion of the polarization layer comprises a layer comprising AlN and a second layer comprising AlInN wherein the second layer of the second portion of the polarization layer is thicker than the second layer of the first portion of the polarization layer.

Example embodiment 9: The transistor of example embodiment 1, 2, 3, 4, 5, 6, 7 or 8 wherein the polarization layer has a third portion having a third thickness, wherein the third thickness is greater than the second thickness, the third portion beneath a third gate portion of the gate stack along a third portion of the gate width.

Example embodiment 10: The transistor of example embodiment 1, 2, 3, 4, 5, 6, 7, 8 or 9 further comprising a pair of sidewall spacers on opposite sides of the gate stack along the gate width, one of the sidewall spacers of the pair of sidewall spacers formed on a source portion of the polarization layer, and the other sidewall spacer of the pair of sidewall spacers disposed on a drain portion of the polarization layer, the source and drain portions of the polarization layer having a thickness greater than the second thickness of the polarization layer.

Example embodiment 11: The transistor of example embodiment 1, 2, 3, 4, 5, 6, 7, 8. 9 or 10 wherein the polarization layer has a plurality of the first portions and a plurality of the second portions, wherein the first portions are interleaved with the second portions.

Example embodiment 12: A transistor includes a fin comprising gallium nitride disposed on a substrate, the fin having a pair of laterally opposite sidewalls, and a top surface between the pair of laterally opposite sidewalls, a polarization layer on the top surface of the fin but not on the pair of laterally opposite sidewalls of the fin, a gate stack on the polarization layer on the top surface of the fin, and on the pair of laterally opposite sidewalls of the fin. a source region on a first side of the gate stack, and a drain region on a second side of the gate stack, the second side opposite the first side.

Example embodiment 13: The transistor of example embodiment 12, wherein the polarization layer is sufficiently thick so that the transistor has a first threshold voltage for a first portion of the gate stack along the pair or laterally opposite sidewalls and a second threshold voltage for a second portion of the gate stack along the top surface of the fin, wherein the first threshold voltage is greater than the second threshold voltage.

Example embodiment 14: The transistor of example embodiment 12 or 13, wherein the polarization layer has a thickness sufficient to create a 2DEG layer in the top surface of the fin.

Example embodiment 15: The transistor of example embodiment 12 or 13, wherein the polarization layer is not sufficiently thick to create a 2DEG layer in the top surface of the fin.

Example embodiment 16: The transistor of example embodiment 12, 13, 14 or 15, wherein the polarization layer comprises aluminum, indium and nitrogen.

Example embodiment 17: The transistor of example embodiment 12, 13, 14, 15 or 16, wherein the gate stack comprises a gate dielectric layer and a gate electrode on the gate dielectric layer.

Example embodiment 18: An RF power amplifier including a transistor having a gallium nitride layer, a gate stack above the gallium nitride layer, a source region on a first side of the gate stack and a drain region on a second side of the gate stack, the second side opposite the first side, the transistor having a first threshold voltage for a first gate portion of the gate stack and a second threshold voltage for a second gate portion of the gate stack, the first threshold voltage greater than the second threshold voltage, and a matching network coupled to the transistor.

Example embodiment 19: The RF power amplifier of example embodiment 18 wherein the transistor further comprises a polarization layer beneath the gate stack and above the gallium nitride layer, the polarization layer having a first portion having a first thickness beneath the first gate portion and a second portion having a second thickness beneath the second gate portion, the second thickness greater than the first thickness.

Example embodiment 20: The RF power amplifier of example embodiment 19 wherein the first thickness is a zero thickness.

Example embodiment 21: The RF power amplifier of example embodiment 19 wherein the first thickness is a non-zero thickness.

Example embodiment 22: The RF power amplifier of example embodiment 18, 19, 20, 21 wherein the polarization layer comprises aluminum, indium and nitrogen.

Example embodiment 23: The RF power amplifier of example embodiment 18, 19, 20, 21 or 22 wherein the RF amplifier does not include an external power combiner.

What is claimed is:

1. A transistor comprising:
    a gallium nitride layer over a substrate;
    a gate stack over the gallium nitride layer, the gate stack comprising a gate electrode;
    a source region on a first side of the gate stack;
    a drain region on a second side of the gate stack, the second side opposite the first side, wherein the gate stack has a gate length in a first direction extending from the source region to the drain region, the gate stack having a gate width in a second direction perpendicular to the first direction and parallel to the source region and the drain region; and
    a polarization layer beneath the gate stack and on the GaN layer, the polarization layer having a first portion having a first thickness vertically beneath a first gate portion of the gate electrode of the gate stack, the polarization layer having a second portion having a second thickness vertically beneath a second gate portion of the gate electrode of the gate stack, the first gate portion along a first portion of the gate width and the second gate portion along a second portion of the gate width, wherein the second thickness is greater than the first thickness.

2. The transistor of claim 1 wherein the first thickness is a zero thickness.

3. The transistor of claim 1 wherein the first thickness is a non-zero thickness.

4. The transistor of claim 1 wherein the second thickness is sufficiently thicker compared to the first thickness such that the transistor has a first threshold voltage for the first gate portion and a second threshold voltage for the second gate portion, wherein the first threshold voltage is greater than the second threshold voltage.

5. The transistor of claim 1 wherein the gate stack comprises a gate dielectric above the GaN layer and the gate electrode on the gate dielectric.

6. The transistor of claim 1 wherein the polarization layer comprises: aluminum, indium, gallium and nitrogen.

7. The transistor of claim 6 wherein the polarization layer comprises:
    a first layer comprising aluminum and nitride;
    a second layer on the first layer, the second layer comprising aluminum, gallium and nitrogen; and
    a third layer on the second layer, the third layer comprising aluminum, indium and nitrogen.

8. The transistor of claim 1 wherein the first portion of the polarization layer comprises a first layer comprising AlN and a second layer comprising AlInGaN and wherein the second portion of the polarization layer comprises a layer comprising AlN and a second layer comprising AlInGaN wherein the second layer of the second portion of the polarization layer is thicker than the second layer of the first portion of the polarization layer.

9. The transistor of claim 1 wherein the polarization layer has a third portion having a third thickness, wherein the third thickness is greater than the second thickness, the third portion beneath a third gate portion of the gate stack along a third portion of the gate width.

10. The transistor of claim 1 further comprising a pair of sidewall spacers on opposite sides of the gate stack along the gate width, one of the sidewall spacers of the pair of sidewall spacers formed on a source portion of the polarization layer, and the other sidewall spacer of the pair of sidewall spacers disposed on a drain portion of the polarization layer, the source and drain portions of the polarization layer having a thickness greater than the second thickness of the polarization layer.

11. The transistor of claim 1 wherein the polarization layer has a plurality of the first portions and a plurality of the second portions, wherein the first portions are interleaved with the second portions.

12. A transistor comprising:
    a gallium nitride layer over a substrate;
    a gate stack over the gallium nitride layer;
    a source region on a first side of the gate stack;

a drain region on a second side of the gate stack, the second side opposite the first side, wherein the gate stack has a gate length in a first direction extending from the source region to the drain region, the gate stack having a gate width in a second direction perpendicular to the first direction and parallel to the source region and the drain region; and a polarization layer beneath the gate stack and on the GaN layer, the polarization layer having a first portion having a first thickness under a first gate portion of the gate stack, the polarization layer having a second portion having a second thickness under a second gate portion of the gate stack, the first gate portion along a first portion of the gate width and the second gate portion along a second portion of the gate width, wherein the second thickness is greater than the first thickness, wherein the second thickness is sufficiently thicker compared to the first thickness such that the transistor has a first threshold voltage for the first gate portion and a second threshold voltage for the second gate portion, wherein the first threshold voltage is greater than the second threshold voltage.

13. A transistor comprising:
a gallium nitride layer over a substrate;
a gate stack over the gallium nitride layer;
a source region on a first side of the gate stack;
a drain region on a second side of the gate stack, the second side opposite the first side, wherein the gate stack has a gate length in a first direction extending from the source region to the drain region, the gate stack having a gate width in a second direction perpendicular to the first direction and parallel to the source region and the drain region; and
a polarization layer beneath the gate stack and on the GaN layer, the polarization layer having a first portion having a first thickness under a first gate portion of the gate stack, the polarization layer having a second portion having a second thickness under a second gate portion of the gate stack, the first gate portion along a first portion of the gate width and the second gate portion along a second portion of the gate width, wherein the second thickness is greater than the first thickness, wherein the first portion of the polarization layer comprises a first layer comprising AlN and a second layer comprising AlInGaN and wherein the second portion of the polarization layer comprises a layer comprising AlN and a second layer comprising AlInGaN wherein the second layer of the second portion of the polarization layer is thicker than the second layer of the first portion of the polarization layer.

14. A transistor comprising:
a gallium nitride layer over a substrate;
a gate stack over the gallium nitride layer;
a source region on a first side of the gate stack;
a drain region on a second side of the gate stack, the second side opposite the first side, wherein the gate stack has a gate length in a first direction extending from the source region to the drain region, the gate stack having a gate width in a second direction perpendicular to the first direction and parallel to the source region and the drain region; and
a polarization layer beneath the gate stack and on the GaN layer, the polarization layer having a first portion having a first thickness under a first gate portion of the gate stack, the polarization layer having a second portion having a second thickness under a second gate portion of the gate stack, the first gate portion along a first portion of the gate width and the second gate portion along a second portion of the gate width, wherein the second thickness is greater than the first thickness, wherein the polarization layer has a third portion having a third thickness, wherein the third thickness is greater than the second thickness, the third portion beneath a third gate portion of the gate stack along a third portion of the gate width.

15. A transistor comprising:
a gallium nitride layer over a substrate;
a gate stack over the gallium nitride layer;
a source region on a first side of the gate stack;
a drain region on a second side of the gate stack, the second side opposite the first side, wherein the gate stack has a gate length in a first direction extending from the source region to the drain region, the gate stack having a gate width in a second direction perpendicular to the first direction and parallel to the source region and the drain region;
a polarization layer beneath the gate stack and on the GaN layer, the polarization layer having a first portion having a first thickness under a first gate portion of the gate stack, the polarization layer having a second portion having a second thickness under a second gate portion of the gate stack, the first gate portion along a first portion of the gate width and the second gate portion along a second portion of the gate width, wherein the second thickness is greater than the first thickness; and
a pair of sidewall spacers on opposite sides of the gate stack along the gate width, one of the sidewall spacers of the pair of sidewall spacers formed on a source portion of the polarization layer, and the other sidewall spacer of the pair of sidewall spacers disposed on a drain portion of the polarization layer, the source and drain portions of the polarization layer having a thickness greater than the second thickness of the polarization layer.

16. A transistor comprising:
a gallium nitride layer over a substrate;
a gate stack over the gallium nitride layer;
a source region on a first side of the gate stack;
a drain region on a second side of the gate stack, the second side opposite the first side, wherein the gate stack has a gate length in a first direction extending from the source region to the drain region, the gate stack having a gate width in a second direction perpendicular to the first direction and parallel to the source region and the drain region; and
a polarization layer beneath the gate stack and on the GaN layer, the polarization layer having a first portion having a first thickness under a first gate portion of the gate stack, the polarization layer having a second portion having a second thickness under a second gate portion of the gate stack, the first gate portion along a first portion of the gate width and the second gate portion along a second portion of the gate width, wherein the second thickness is greater than the first thickness, wherein the polarization layer has a plurality of the first portions and a plurality of the second portions, wherein the first portions are interleaved with the second portions.

* * * * *